(12) United States Patent
Yamazaki

(10) Patent No.: US 6,879,267 B2
(45) Date of Patent: Apr. 12, 2005

(54) SOFT-OUTPUT DECODER WITH COMPUTATION DECISION UNIT

(75) Inventor: Masato Yamazaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/852,654

(22) Filed: May 25, 2004

(65) Prior Publication Data

US 2005/0052293 A1 Mar. 10, 2005

Related U.S. Application Data

(63) Continuation of application No. 10/420,002, filed on Apr. 22, 2003, now abandoned.

(30) Foreign Application Priority Data

Apr. 26, 2002 (JP) ........................................ 2002-125494

(51) Int. Cl.$^7$ .............................................. H03M 7/40
(52) U.S. Cl. .......................... 341/64; 375/330; 714/784
(58) Field of Search ............................. 341/64, 50, 51; 375/136, 330, 340; 714/784, 786, 792, 793

(56) References Cited

U.S. PATENT DOCUMENTS

| 5,706,313 | A | * | 1/1998 | Blasiak et al. ............... 375/330 |
| 5,721,745 | A | * | 2/1998 | Hladik et al. ................ 714/755 |
| 5,721,746 | A | * | 2/1998 | Hladik et al. ................ 714/792 |
| 5,887,035 | A | * | 3/1999 | Molnar ........................ 375/340 |
| 5,970,098 | A | * | 10/1999 | Herzberg ..................... 375/264 |
| 6,038,696 | A | * | 3/2000 | Chouly et al. ............... 714/786 |
| 6,377,610 | B1 | * | 4/2002 | Hagenauer et al. ......... 375/136 |
| 6,634,007 | B1 | * | 10/2003 | Koetter et al. .............. 714/784 |
| 6,671,852 | B1 | * | 12/2003 | Ariel et al. .................. 714/793 |

FOREIGN PATENT DOCUMENTS

| EP | 1083752 | * | 3/2001 |
| JP | 2000-216689 | | 8/2000 |
| JP | 2003-023359 | | 1/2003 |

OTHER PUBLICATIONS

Yamaguchi et al., "Turbo code: a new coding system approaches the Shannon limit", Nikkei Electronics No. 721 (Jul. 13, 1998), pp. 163–177

* cited by examiner

Primary Examiner—Jean Bruner Jeanglaude
(74) Attorney, Agent, or Firm—Rabin & Berdo, P.C.

(57) ABSTRACT

A soft-output decoder that uses a-priori likelihood values to compute metrics while decoding a received data stream also uses the a-priori likelihood values to decide whether or not to compute the metrics for each position in the received data stream. Unnecessary computation can thereby be avoided, saving time and power. In an iterated soft-output decoding scheme, the soft-output decoder may decide whether or not to compute metrics for each position in the next iteration of the soft-output decoding process. These decisions may also be used to decide when to terminate the decoding process.

20 Claims, 23 Drawing Sheets

SOFT-OUTPUT DECODER WITH COMPUTATION DECISION UNIT

CROSS-REFERENCE TO RELATED APPLICATION

This application is a continuing application of applicant's copending prior application Ser. No. 10/420,002, filed Apr. 22, 2003 is now abandoned.

BACKGROUND OF THE INVENTION

1. Field of the Invention

The present invention relates generally to turbo decoding apparatus, and more particularly to a soft-output decoder that decodes a received data stream by making soft decisions.

2. Description of the Related Art

FIG. 19 shows the general structure of a turbo code transmission system. The system includes a turbo coder 100, a modulator (MOD) 200, a communication channel (CHNL) 300, a demodulator (DEMOD) 400, and a turbo decoder 500.

The turbo coder 100 includes a first recursive systematic convolutional coder 101a, a second recursive systematic convolutional coder 101b, and an interleaver 102. The input data Din of the turbo coder 100 are binary data. The turbo coder 100 has, for example, a coding rate of ⅓ and a constraint length of four.

When a data stream Din is supplied, since the coding rate is ⅓, the turbo coder 100 outputs three data streams $X_1$, $Y_1$, $Y_2$. Output data stream $X_1$ is identical to the input data stream Din. Output data stream $Y_1$ is obtained by the first recursive systematic convolutional coder 101a from the input data stream Din. Output data stream $Y_2$ is obtained by the second recursive systematic convolutional coder 101b from an interleaved data stream supplied by the interleaver 102. The interleaver 102 receives the input data stream Din and rearranges the data sequence according to a fixed procedure, thereby generating the interleaved data stream.

The first and second recursive systematic convolutional coders 101a, 101b have the same internal structure. This structure is shown in FIG. 20, in which reference numeral 101 designates either the first recursive systematic convolutional coder 101a or the second recursive systematic convolutional coder 101a or the second recursive systematic convolutional coder 101b.

Since the constraint length is four, the recursive systematic convolutional coder 101 comprises a shift register with three register cells 111, 112, 113. The recursive systematic convolutional coder 101 also comprises four exclusive-OR logic circuits 114, 115, 116, 117. Initially, the register cells 111, 112, 113 are all cleared. As each bit of the input data stream Din is received at the input terminal IN, exclusive-OR logic circuit 117 takes the exclusive logical OR of the output of register cells 112 and 113; exclusive-OR logic circuit 114 then takes the exclusive logical OR of the output of exclusive-OR logic circuit 117 and the input data bit from the input data stream Din; exclusive-OR logic circuit 115 takes the exclusive logical OR of the output of exclusive-OR logic circuit 114 and the first register cell 111; and exclusive-OR logic circuit 116 takes the exclusive logical OR of the output of exclusive-OR logic circuit 115 and the third register cell 113. The output of exclusive-OR logic circuit 116 is output from an output terminal (OUT) as the coded bit $Y_1$ or $Y_2$. Then the output of exclusive-OR logic circuit 114 is shifted into register cell 111 while the output of register cell 111 is shifted into register cell 112 and the output of register cell 112 is shifted into register cell 113. The new contents of the register cells become the outputs of the register cells, and the above process is repeated on the next bit of input data.

The shift register comprising register cells 111, 112, 113 has eight states, depending on whether the output of each register cell is '0' or '1'. From each state, a transition can occur to just two other states, according to the value of the input bit.

In FIG. 19, the modulator 200 modulates the three data streams (transmit data streams) $X_1$, $Y_1$, $Y_2$ received from the turbo coder 100, by quadrature phase shift-keying (QPSK), for example, and sends the modulated streams to the communication channel 300. When the transmitted signals reach the demodulator 400, they include noise acquired in the communication channel 300.

The demodulator 400 demodulates the received signals by the reverse of the process performed by the modulator 200, and outputs received data streams $X_1'$, $Y_1'$, $Y_2'$, which correspond to transmitted data streams $X_1$, $Y_1$, $Y_2$, respectively, but include noise. The received data streams $X_1'$, $Y_1'$, $Y_2'$ may comprise multi-valued (ternary or higher-valued) data.

FIG. 21 is a block diagram illustrating the structure of a conventional turbo decoder, comprising a pair of conventional soft-output decoders 501a, 501b, a pair of interleavers 51, 52, a pair of deinterleavers 53, 54, a selector 55, and a hard decision unit 56.

The turbo code transmission system shown in FIG. 19 and the conventional turbo decoder shown in FIG. 21 are disclosed in *Nikkei Electronics* 721 (Jul. 13, 1998), pages 163 to 177.

In the conventional turbo decoder shown in FIG. 21, the (noisy) received data stream $X_1'$ is input to both the first soft-output decoder 501a and interleaver 51, the (noisy) received data stream $Y_1'$ is input to the first soft-output decoder 501a, and the (noisy) received data stream $Y_2'$ is input to the second soft-output decoder 501b.

The first soft-output decoder 501a outputs an extrinsic information likelihood stream Leout-a to interleaver 52, and the second soft-output decoder second soft-output decoder 501b outputs an extrinsic information likelihood stream Leout-b to deinterleaver 53. Interleaver 51 interleaves received data stream $X_1'$ and outputs the interleaved stream to the second soft-output decoder 501b. Interleaver 52 outputs an a-priori information likelihood stream Lin-b, which is an interleaved stream corresponding to extrinsic information likelihood stream Leout-a, to soft-output decoder 501b. Deinterleaver 53 outputs an a-priori information likelihood stream Lin-a, which is a deinterleaved stream corresponding to extrinsic information likelihood stream Leout-b, to the first soft-output decoder 501a.

In addition, soft-output decoder 501a outputs a soft-decision data stream Lout-a to the selector 55, and soft-output decoder 501b outputs a soft-decision data stream Lout-b output to deinterleaver 54. Deinterleaver 54 outputs a deinterleaved version of soft-decision data stream Lout-b to the selector 55; the selector 55 outputs a selected data stream to the hard decision unit 56; the hard decision unit 56 outputs a turbo-decoded data stream Dout, which corresponds to the transmitted data stream Din (see FIG. 19).

The operation of the conventional turbo decoder shown in FIG. 21 will now be described. The interleavers 51, 52 have the same structure as the interleaver 102 in the turbo coder 100 shown in FIG. 19. Interleaver 51 rearranges the data sequence of data stream $X_1'$ according to a fixed procedure and outputs the interleaved stream to the second soft-output decoder 501b. Interleaver 52 rearranges the data sequence of extrinsic information likelihood stream Leout-a according to the same procedure as used in interleaver 51 and outputs a-priori information likelihood stream Lin-b to the second soft-output decoder 501b.

The deinterleavers 53, 54, which both have the same internal structure, restore the interleaved data streams to their original sequence. Deinterleaver 53 deinterleaves the data sequence of extrinsic information likelihood stream Leout-b by performing the reverse of the process performed by interleaver 51 or interleaver 52, and outputs a-priori information likelihood stream Lin-a to the first soft-output decoder 501a. Deinterleaver 54 deinterleaves the data sequence of soft-decision data stream Lout-b by the same procedure as used in deinterleaver 53 and outputs the deinterleaved stream to the selector 55.

The first soft-output decoder 501a uses the (noisy) data streams $X_1'$ and $Y_1'$ to perform calculations that estimate the transmitted data stream $X_1$. (Din), and outputs the soft-decision data stream Lout-a and extrinsic information likelihood stream Leout-a, which are obtained as results of these calculations. The a-priori information likelihood stream Lin-a is also input to the first soft-output decoder 501a. In the first iteration of the soft-decision decoding process, however, soft-output decoder 501a does not use the a-priori information likelihood stream Lin-a because the initial values thereof are all '0'.

The second soft-output decoder 501b uses the interleaved (noisy) data stream $X_1'$, the (noisy) data stream $Y_2'$, and the a-priori information likelihood stream Lin-b obtained by interleaving the extrinsic information likelihood stream Leout-a to perform calculations that estimate the interleaved transmitted data stream $X_1$ (Din), and outputs the soft-decision data stream Lout-b and extrinsic information likelihood stream Leout-b, which are obtained as results of these calculations.

The first soft-output decoder 501a now uses the (noisy) data stream $X_1'$, (noisy) data stream $Y_1'$, and a-priori information likelihood stream Lin-a obtained by deinterleaving the extrinsic information likelihood stream Leout-b to repeat the soft-decision decoding calculations that estimate the transmitted data stream $X_1$ (Din), and outputs the resulting soft-decision data stream Lout-a and extrinsic information likelihood stream Leout-a.

The second soft-output decoder 501b then uses the interleaved data stream $X_1'$, data stream $Y_2'$, and the a-priori information likelihood stream Lin-b obtained by interleaving the recalculated extrinsic information likelihood stream Leout-a output from the first soft-output decoder 501a to repeat the soft-decision decoding calculations that estimate the interleaved transmitted data stream $X_1$ (Din), and outputs the resulting soft-decision data stream Lout-b and the extrinsic information likelihood stream Leout-b.

The soft-output decoders 501a, 501b iterate the soft-decision decoding process described above a prescribed number of times.

When the soft-output decoders 501a, 501b have finished the prescribed number of iterations of the soft-decision decoding process, the selector 55 selects either the soft-decision data stream Lout-a output from the first soft-output decoder 501a or the deinterleaved soft-decision data stream Lout-b output from deinterleaver 54, and outputs the selected soft-decision data stream to the hard decision unit 56.

The hard decision unit 56 uses the selected soft-decision data stream to make a hard decision (binary 0 or 1) at each bit position in the transmitted data stream $X_1$ (Din)., and outputs the resulting binary data stream as a decoded data stream Dout, which is the output of the turbo decoder.

FIG. 22 illustrates the data sequences of the following data streams transmitted and received in the turbo code transmission system $X_1$ (transmitted data stream input to the first recursive systematic convolutional coder 101a), $X_1$-interleaved (transmitted data stream output from the interleaver 102 and input to the second recursive systematic convolutional coder 101b), $Y_1$ (transmitted data stream output from the first recursive systematic convolutional coder 101a), $Y_2$ (transmitted data stream output from the second recursive systematic convolutional coder 101b), $X_1'$ (received data stream input to soft-output decoder 501a), $X_1'$-interleaved (received data stream output from interleaver 51), $Y_1'$ (received data stream input to soft-output decoder 501a), $Y_1'$-interleaved (virtual stream, because the received data stream $Y_1'$ is not input to an interleaver), $Y_2'$ (received data stream input to soft-output decoder 501b), and $Y_2'$ interleaved (virtual stream, because the received data stream $Y_2'$ is not input to an interleaver). For brevity, each data stream has four data elements in four positions $k_1$, $k_2$, $k_3$, $k_4$, which are decoding positions in the received data stream.

Data stream $X_1$, the transmitted data stream input to the first recursive systematic convolutional coder 101a, has data elements $x_1$, $x_2$, $x_3$, $x_4$ in positions $k_1$, $k_2$, $k_3$, $k_4$, respectively. The data elements $x_1$, $x_2$, $x_3$, $x_4$ are input to the first recursive systematic convolutional coder 101a in that order.

Data stream $Y_1$, the transmitted data stream output from the first recursive systematic convolutional coder 101a, has data elements $y_1$, $y_2$, $y_3$, $y_4$ in positions $k_1$, $k_2$, $k_3$, $k_4$, respectively.

Data stream $X_1$-interleaved, the transmitted data stream output from the interleaver 102, has, for instance, data elements $x_3$, $x_1$, $x_4$, and $x_2$ in positions $k_1$, $k_2$, $k_3$, $k_4$, respectively. This interleaving sequence is only one of the various possible interleaving sequences that may be used. The data elements $x_3$, $x_1$, $x_4$, and $x_2$ of this data stream $x_1$-interleaved are input to the second recursive systematic convolutional coder 101b in the interleaved order.

Data stream $Y_2$, the transmitted data stream output from the second recursive systematic convolutional coder 101b, has data elements $z_3$, $z_1$, $z_4$, and $z_2$ in positions $k_1$, $k_2$, $k_3$, $k_4$ respectively.

Data stream $X_1'$, the received data stream corresponding to the transmitted data stream $X_1$ and input to soft-output decoder 501a, has data elements $x_1'$, $x_2'$, $x_3'$, $x_4'$, corresponding to transmitted data elements $x_1$, $x_2$, $x_3$, $x_4$, in positions $k_1$, $k_2$, $k_3$, $k_4$, respectively.

Data stream $Y_1'$, the received data stream corresponding to transmitted data stream $Y_1$ and input to soft-output decoder 501a, has data elements $y_1'$, $y_2'$, $y_3'$, $y_4'$, corresponding to transmitted data elements $y_1$, $y_2$, $y_3$, $y_4$, in positions $k_1$, $k_2$, $k_3$, $k_4$, respectively.

Data stream $X_1'$-interleaved, the received data stream output from interleaver 51 and input to soft-output decoder 501b, has, for instance, data elements $x_3'$, $x_1'$, $x_4'$, $x_2'$ in positions $k_1$, $k_2$, $k_3$, $k_4$, respectively, matching the interleaving sequence used by interleaver 102.

Data stream $Y_1'$-interleaved, which is a virtual received data stream that would be output from interleaver 51 if interleaver 51 received data stream $Y_1'$, has data elements $y_3'$, $y_1'$, $y_4'$, $y_2'$ in positions $k_1$, $k_2$, $k_3$, $k_4$, respectively.

Data stream $Y_2'$, the received data stream corresponding to transmitted data stream $Y_2$ and input to soft-output decoder 501b, has data elements $z_3'$, $z_1'$, $z_4'$, $z_2'$, corresponding to transmitted data elements $z_3$, $z_1$, $z_4$, $z_2$, in positions $k_1$, $k_2$, $k_3$, $k_4$, respectively.

Data stream $Y_2'$-deinterleaved, which is a virtual received data stream that would be output from deinterleaver 53 if deinterleaver 53 received data stream $Y_2'$, has data elements $z_1'$, $z_2'$, $z_3'$, $z_4'$ in positions $k_1$, $k_2$, $k_3$, $k_4$, respectively.

The a-priori information likelihood stream Lin-a input to soft-output decoder 501a and the soft-decision data stream Lout-a and extrinsic information likelihood stream Leout-a output from soft-output decoder 501a have data sequences associated with the data streams $X_1$, $Y_1'$, and $Y_2'$-deinterleaved. In decoding position $k_1$, for instance, the a-priori information likelihood stream Lin-a has the a-priori likelihood values of received data elements $x_1'$, $y_1'$, and $z_1'$.

The a-priori information likelihood stream Lin-b input to soft-output decoder 501b and the soft-decision data stream Lout-b and extrinsic information likelihood stream Leout-b output from soft-output decoder 501b have data sequences associated with the data streams $X_1'$-interleaved, $Y_1'$-interleaved, and $Y_2'$. In decoding position $k_1$, for instance, the a-priori information likelihood stream Lin-b has the a-priori information likelihood values of received data elements $x_3'$, $y_3'$, and $z_3'$.

FIG. 23 is a flowchart illustrating the soft-decision decoding algorithm, referred to as the maximum a-posteriori probability (MAP) decoding algorithm.

In step S2, the received data stream Xin ($X_1'$ or $X_1'$interleaved in FIG. 21), the received data stream Yin ($Y_1'$ or $Y_2'$ in FIG. 21), and the a-priori information likelihood stream Lin (Lin-a or Lin-b in FIG. 21) are used to compute branch metric values (also referred to below as branch metrics). In the first soft-decision decoding process, the received data streams Xin and Yin are used for the branch metric computation. The branch metric computations are performed sequentially for each position in the data streams. The branch metrics indicate the probability of existence of state transition paths resulting from data input to the turbo coder.

In step S3, the branch metrics obtained in step S2 are used to compute forward state metrics by recursion. These computations are also performed sequentially for each position in the data streams. The forward state metrics, also referred to below as forward recursion state metrics or forward recursion state metric values, indicate the probability of existence of each state encountered when paths are traced forward in time on the basis of the branch metrics.

In step S4, the branch metrics obtained in step S2 are used to compute backward state metrics by recursion. These computations are also performed sequentially for each position in the data stream. The backward state metrics, also referred to below as backward recursion state metrics or backward recursion state metric values, indicate the probability of existence of each state found when paths are traced backward in time on the basis of the branch metrics.

In step 55, the branch metrics obtained in step S2 and the state metrics obtained in steps S3 and S4 are used to perform a soft-decision computation for each decoding position in the transmitted data stream $X_1$ (Din in FIG. 19), and the soft-decision data stream obtained by these computations is output.

In the flowchart shown in FIG. 23, the forward recursion state metric computations are performed before the backward recursion state metric computations. The MAP decoding algorithm allows the forward recursion state metric computations and the backward recursion state metric computations to be performed in the reverse order, however, or to be performed simultaneously (in parallel).

FIG. 24 is a block diagram illustrating the structure of a conventional soft-output decoder 501 (the first soft-output decoder 501a or second soft-output decoder 501b in FIG. 21). Input data stream Xin in FIG. 24 corresponds to $X_1$'or $X_1'$-interleaved in FIG. 21. Input data stream Yin corresponds to $Y_1'$ or $Y_2'$ in FIG. 21. A-priori information likelihood stream Lin corresponds to Lin-a or Lin-b in FIG. 21. The extrinsic information likelihood stream Leout corresponds to Leout-a or Leout-b in FIG. 21. The soft-decision data stream Lout corresponds to Lout-a or Lout-b in FIG. 21.

The conventional soft-output decoder 501 comprises a branch metric computation (COMP.) unit 511, a likelihood RAM 12, a branch metric RAM 13, a forward recursion state metric (FRSM) computation unit 516f, a backward recursion state metric (BRSM) computation unit 516r, a forward recursion state metric RAM 17f, a backward recursion state metric RAM 17r, a soft-decision computation (SDC) unit 18, and a differential (DIFF.) computation unit 19.

The operation of the conventional soft-output decoder 501 shown in FIG. 24 will now be described. The soft-decision decoding process is carried out on a data stream equal in length to a positive integer n, comprising data elements in the first to n-th positions.

The branch metric computation unit 511 uses the input received data streams Xin and Yin and, except in the first soft-decision decoding iteration, the a-priori information likelihood stream Lin to sequentially perform branch metric computations at corresponding positions in the data streams (this step corresponds to step S2 in FIG. 23), and writes the branch metric values obtained by the computations into the branch metric RAM 13. At the same time, the branch metric computation unit 511 obtains information likelihood values by adding a communication channel value to the a-priori information likelihood at each position of the data stream, and writes the information likelihood values thus obtained in the likelihood RAM 12.

The forward recursion state metric computation unit 516f reads the necessary branch metric values from the branch metric RAM 13, uses them to sequentially perform forward recursion state metric computations for corresponding positions in the data stream (this step corresponds to step S3 shown in FIG. 23), and writes the forward recursion state metrics thus obtained in the forward recursion state metric RAM 17f.

The backward recursion state metric computation unit 516r reads the necessary branch metric values from the branch metric RAM 13, uses them to sequentially perform backward recursion state metric computations for corresponding positions in the data streams (this step corresponds to step S4 shown in FIG. 23), and writes the backward recursion state metrics thus obtained in the backward recursion state metric RAM 17r.

The soft-decision computation unit 18 reads the necessary branch metric values and forward and backward recursion state metric values from the branch metric RAM 13, forward recursion state metric RAM 17f, and backward recursion state metric RAM 17r, uses them to perform soft-decision computations for the corresponding positions in the data stream, and outputs the soft-decision data stream Lout thus obtained to the differential computation unit 19. This soft-decision data stream Lout is also output to the selector 55 or deinterleaver 54 shown in FIG. 21, as the output of the soft-output decoder, and is used for hard-decision computations.

The differential computation unit 19 reads necessary information likelihood values from the likelihood RAM 12, obtains extrinsic information likelihood values by calculating the difference between the information likelihood read from the likelihood RAM 12 and the soft-decision data input from the soft-decision computation unit 18 for each position of the data streams, and outputs the extrinsic information likelihood stream Leout. This extrinsic information likelihood stream Leout is input to interleaver 52 or deinterleaver 53 (FIG. 19), which supplies the a-priori information likelihood stream Lin to the next-stage soft-output decoder (that is, to the other soft-output decoder in FIG. 19).

The conventional soft-output decoder used in turbo decoding accordingly has to perform a great number of computations to calculate the existence probabilities of each state. The turbo decoder iterates the soft-output decoding computations, feeding the likelihood values obtained from each iteration into the next iteration, so the series of computations is repeated a number of times; the number of repetitions is conventionally predetermined according to the signal-to-noise ratio of the communication channel. These repeated computations consume power and take time. For a transmission block with a high signal-to-noise ratio, many of the repetitions may be unnecessary, so much time and power are wasted.

SUMMARY OF THE INVENTION

A general object of the present invention is save time and power in soft-output decoding.

A more specific object is to reduce the number of metric computations performed in the soft-output decoding of data on the basis of a-priori likelihood values.

Another more specific object is to avoid unnecessary iterations of an iterated soft-output decoding process.

The invented soft-output decoder uses a-priori likelihood values to compute metrics pertaining to different decoding positions in a received data stream. The soft-output decoder includes a computation decision unit for deciding whether to compute metric values for each decoding position in the received data stream, based on the a-priori likelihood values. For example, the a-priori likelihood values may be compared with a predetermined threshold, the metric computations being performed or skipped according to the comparison result. Unnecessary metric computations can thereby be skipped when the decoded value is already highly certain, saving time and reducing power consumption.

The decoding process may also be terminated according to these decisions. For example, the decoding process may be terminated when it is decided not to calculate metric values at any position in the received data stream. Unnecessary further soft-output decoding can thereby be avoided.

The invented soft-output decoder may be used in a decoding apparatus that decodes a received data stream by performing an iterated series of soft-decision decoding processes to decode data in the same positions in the data stream repeatedly, the soft-decision data obtained at each iteration being used to generate an a-priori likelihood stream for use in the next iteration. The soft-output decoder includes computation units for computing branch metrics based on the received data stream and the a-priori likelihood stream and computing state metrics from the branch metrics, and a next-stage computation decision unit for using the branch and state metrics to decide whether to compute branch and state metrics in the next iteration, for each decoding position in the received data stream. The soft-output decoder may also include a next-stage termination decision unit for deciding whether the decoding process can be terminated with the next iteration.

DETAILED DESCRIPTION OF THE INVENTION

Figure 1:
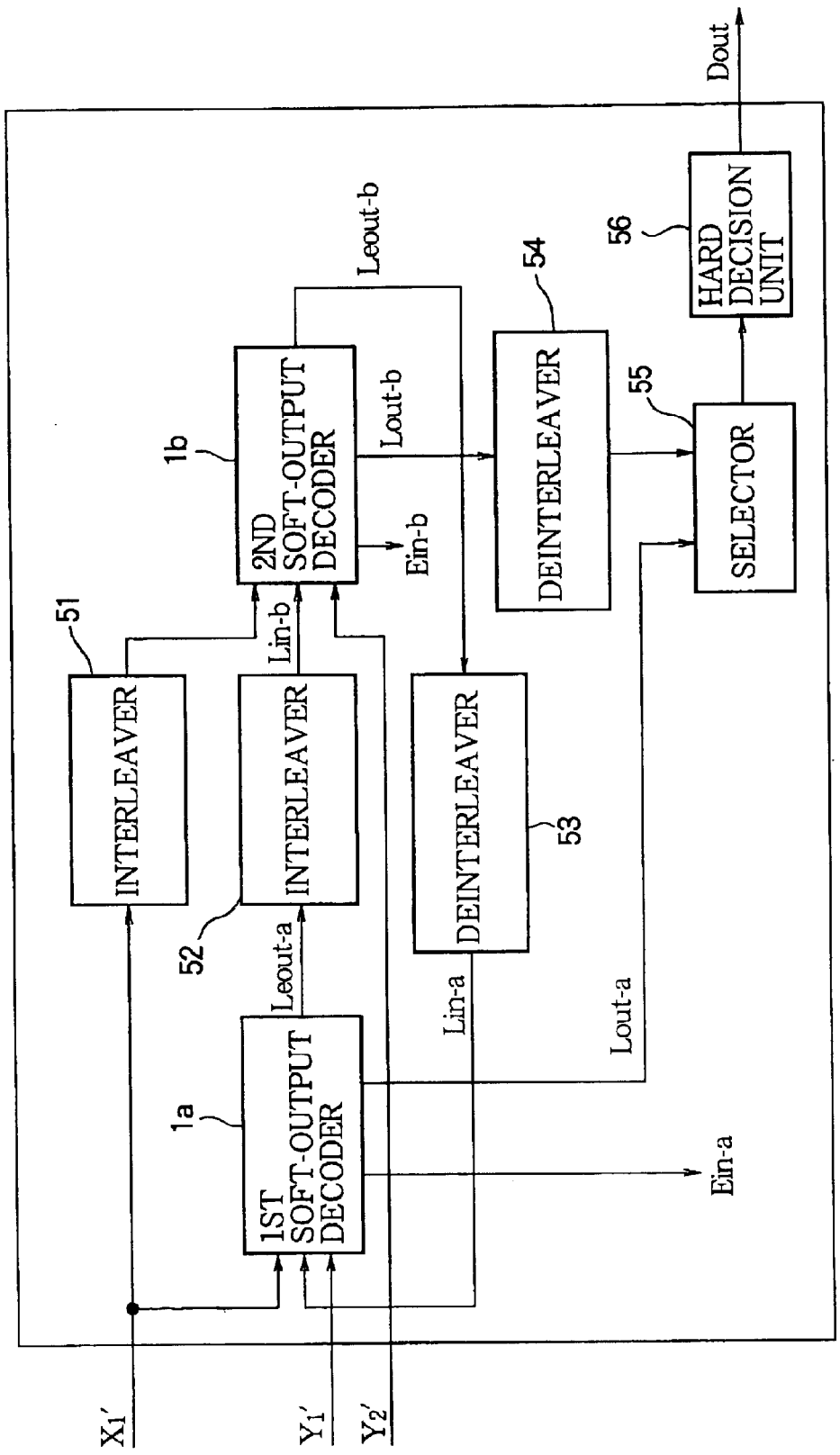
FIG. 1 is a block diagram illustrating the structure of a turbo decoder comprising a pair of soft-output decoders according to a first embodiment of the invention.

Embodiments of the invention will now be described with reference to the attached drawings, in which like elements are indicated by like reference characters.

FIG. 1 is a block diagram of a turbo decoder incorporating a pair of soft-output decoders 1a, 1b according to a first embodiment of the invention. The other components of the turbo decoder are a pair of interleavers 51, 52, a pair of deinterleavers 53, 54, a selector 55, and a hard decision unit 56, which are identical to the corresponding components of the conventional turbo decoder shown in FIG. 21. The first embodiment is thus obtained from the conventional turbo decoder by replacing the soft-output decoders 501a, 501b in FIG. 21 with the novel soft-output decoders 1a, 1b.

Soft-output decoder 1a outputs a soft-decision data stream Lout-a, an extrinsic information likelihood stream Leout-a, and a termination decision flag Ein-a. Soft-output decoder 1b outputs a soft-decision data stream Lout-b, an extrinsic information likelihood stream Leout-b, and a termination decision flag Ein-b. The data in the input and output data streams of the two soft-output decoders 1a, 1b are arranged in the same way as in the conventional turbo decoder, as partially illustrated in FIG. 22.

Figure 21:
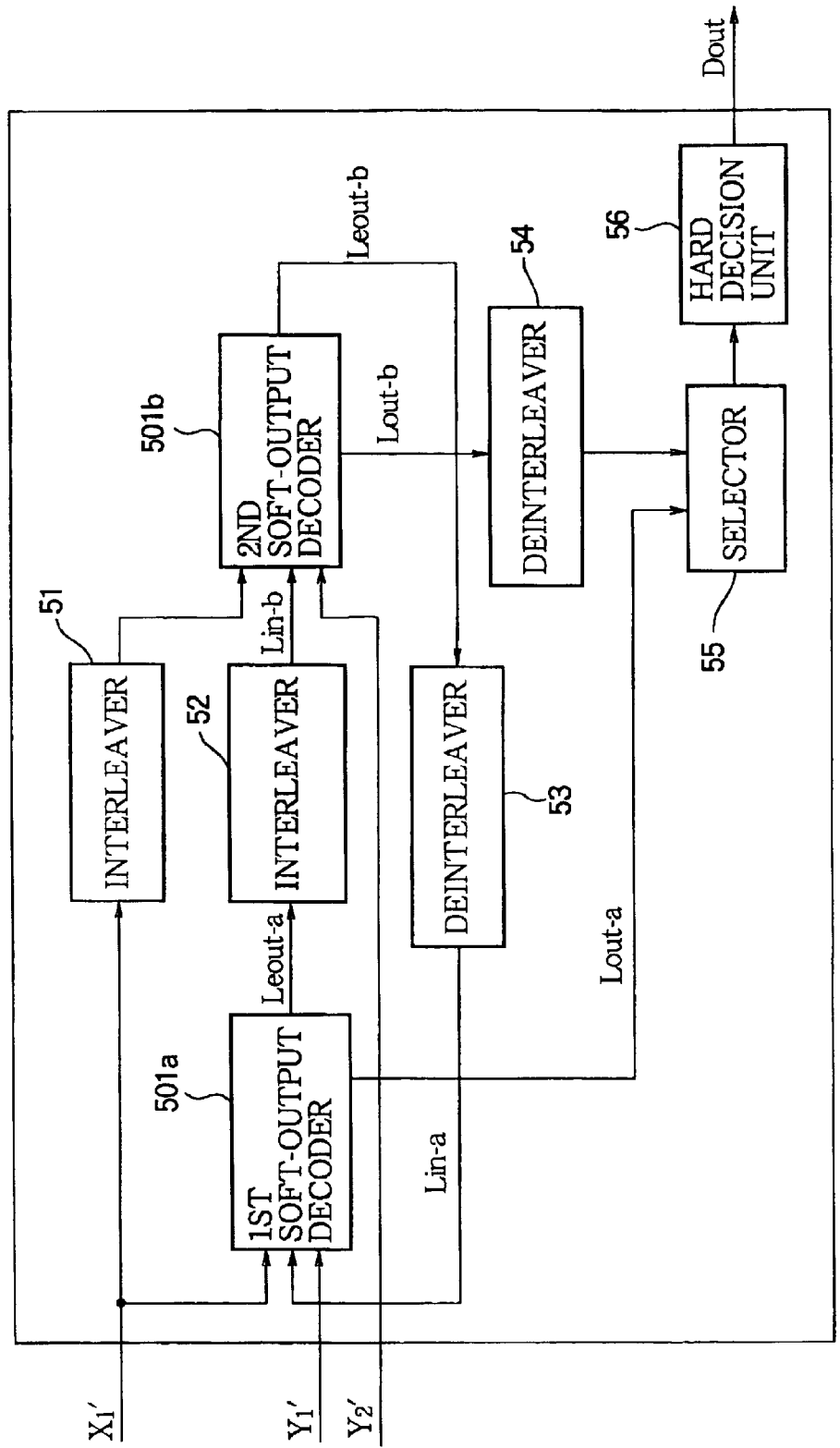
FIG. 21 is a block diagram illustrating the structure of a conventional turbo decoder.

The operation of the turbo decoder in FIG. 1 will be described below, omitting descriptions of operations that are performed identically in the conventional turbo decoder in FIG. 21.

Soft-output decoder 1a uses the (noisy) received data stream $X_1'$, the (noisy) received data stream $Y_1'$, and the a-priori information likelihood stream Lin-a to perform calculations that estimate the transmitted data stream $X_1$ (Din), and outputs the soft-decision data stream Lout-a and the extrinsic information likelihood stream Leout-a that are obtained as results of these calculations. Soft-output decoder 1a also decides whether the soft-decision decoding process can end, and indicates the result of this decision with the termination decision flag Ein-a.

Soft-output decoder 1b uses the interleaved version of the (noisy) received data stream $X_1'$, which will be denoted $X_1'$-interleaved, the (noisy) received data stream $Y_2'$, and the a-priori information likelihood stream Lin-b to perform calculations that estimate an interleaved version of the transmitted data stream $X_1$-interleaved (Din), and outputs the soft-decision data stream Lout-b and the extrinsic information likelihood stream Leout-b that are obtained as results of these calculations. Soft-output decoder 1b also decides whether the soft-decision decoding process can end, and indicates the result of this decision with the termination decision flag Ein-b.

Figure 2:
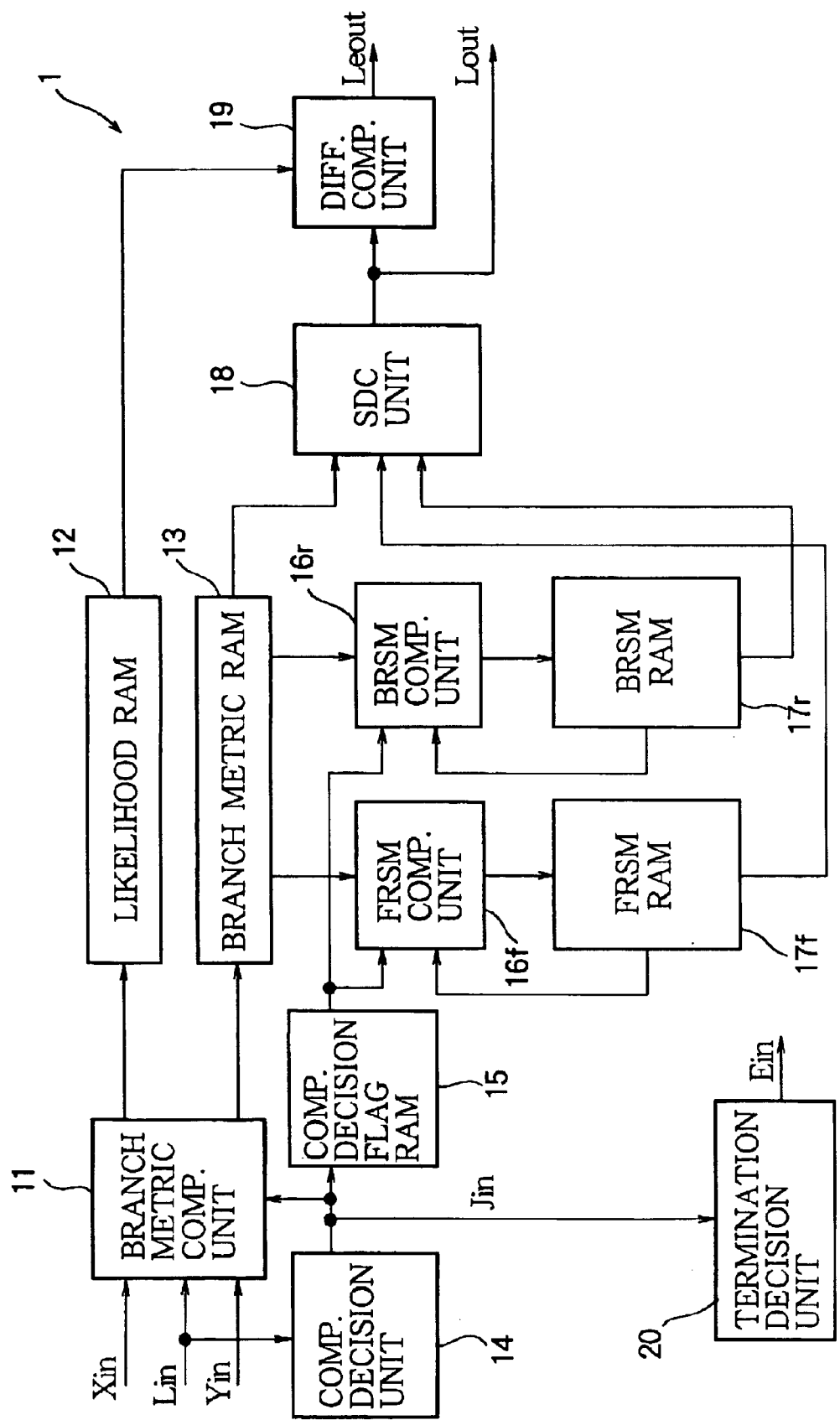
FIG. 2 is a block diagram illustrating the structure of a soft-output decoder according to the first embodiment of the invention.

FIG. 2 is a block diagram illustrating the structure of a soft-output decoder 1 (first soft-output decoder 1a or second soft-output decoder 1b in FIG. 1) according to the first embodiment of the invention. Jin denotes a computation decision flag stream, and Ein represents the termination decision flag Ein-a or Ein-b in FIG. 1.

The soft-output decoder 1 in the first embodiment comprises a branch metric computation. (COMP.) unit 11, a likelihood RAM 12, a branch metric RAM 13, a computation (COMP.) decision unit 14, a computation (COMP.) decision flag RAM 15, a forward recursion state metric (FRSM) computation unit 16f, a backward recursion state metric (BRSM) computation unit 16r, a forward recursion state metric RAM 17f, a backward recursion state metric RAM 17r, a soft-decision computation (SDC) unit 18, a differential (DIFF.) computation unit 19, and a termination decision unit 20.

Figure 24:
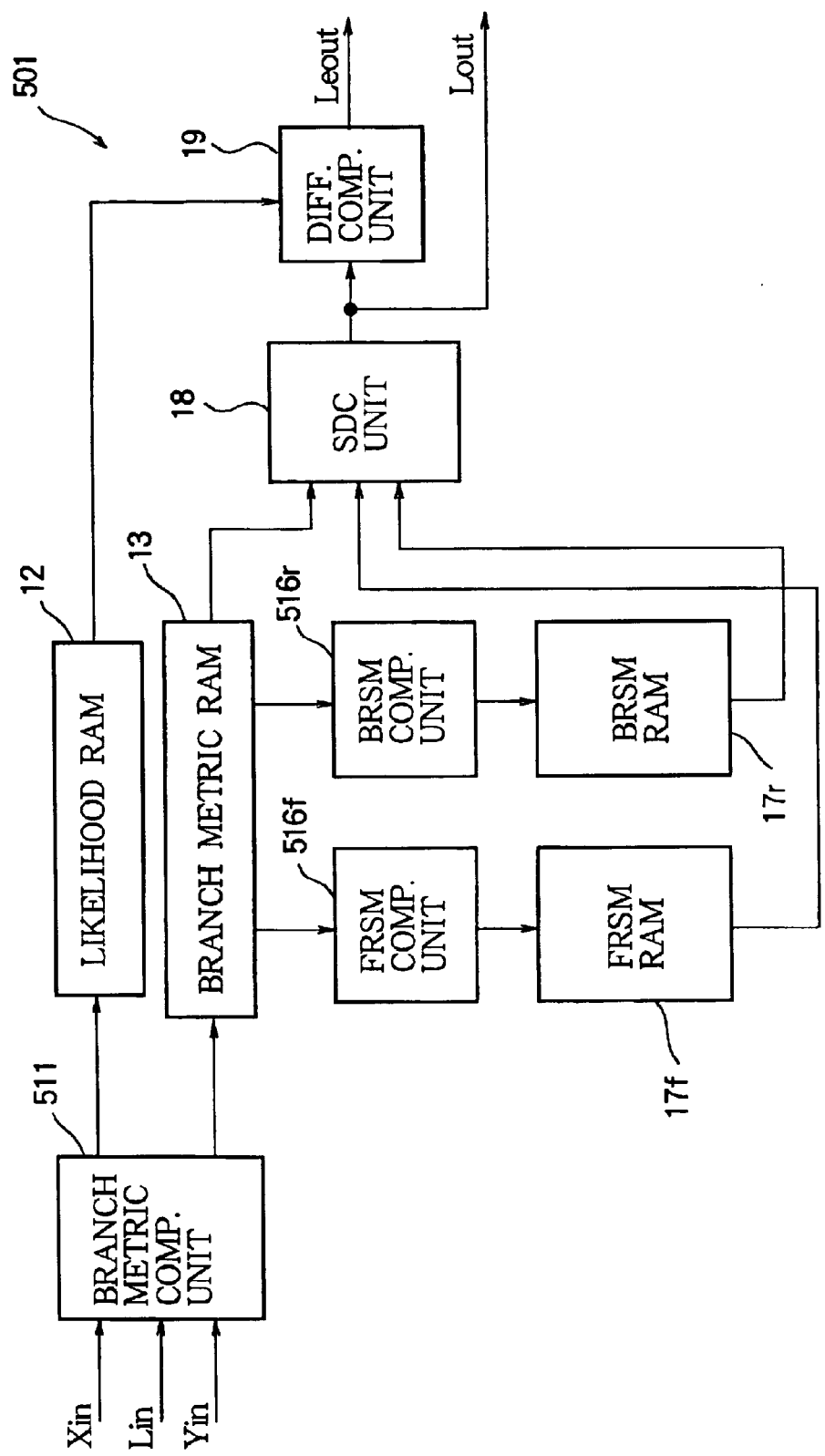
FIG. 24 is a block diagram illustrating the structure of a conventional soft-output decoder.

The soft-output decoder in the first embodiment is thus obtained from the conventional soft-output decoder 501 by adding the computation decision unit 14, computation decision flag RAM 15, and termination decision unit 20 and replacing the branch metric computation unit 511, forward recursion state metric computation unit 516f, and backward recursion state metric computation unit 516r in FIG. 24 with branch metric computation unit 11, forward recursion state metric computation unit 16f, and backward recursion state metric computation unit 16r, respectively.

Figure 3:
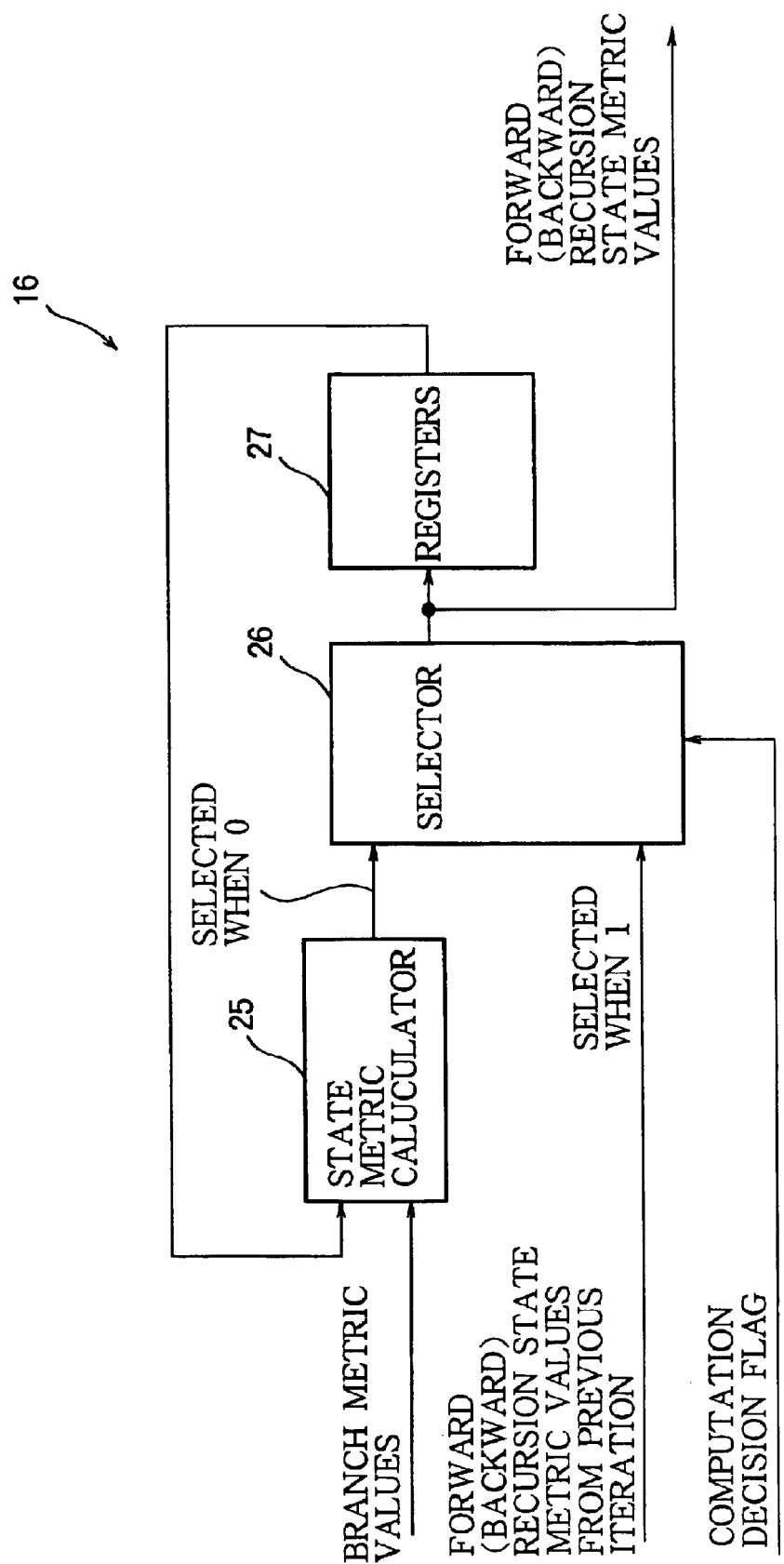
FIG. 3 is a block diagram illustrating the structure of a state metric computation unit in the soft-output decoder according to the first embodiment of the invention.

FIG. 3 is a block diagram illustrating the structure of the state metric computation unit 16 (forward recursion state metric computation unit 16f or backward recursion state metric computation unit 16r) in FIG. 2. The state metric computation unit 16 in the first embodiment comprises a state metric calculator 25, a selector 26, and a group of registers 27.

Figure 4:
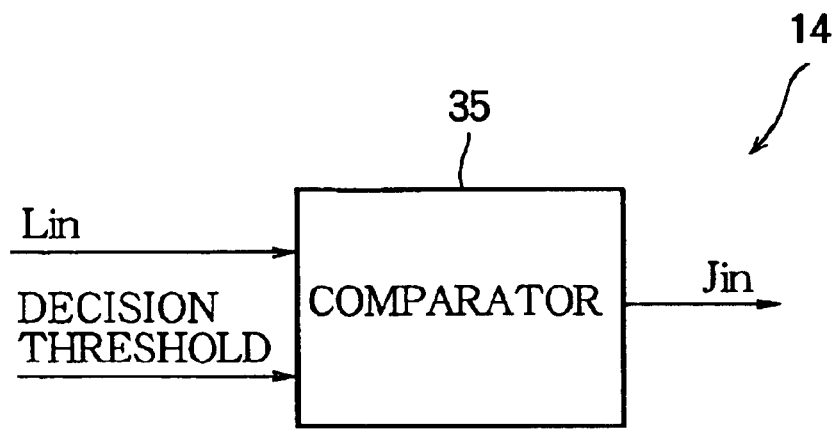
FIG. 4 is a block diagram illustrating the structure of a computation decision unit in the soft-output decoder according to the first embodiment of the invention.

FIG. 4 is a block diagram illustrating the structure of the computation decision unit 14 in FIG. 2. The computation decision unit 14 comprises a comparator 35 that receives sequential input of an a-priori information likelihood stream Lin giving an a-priori information likelihood for each position in the data stream, and compares the received likelihood values with a prescribed decision threshold. The output of comparator 35 is a computation decision flag stream Jin, comprising a computation decision flag for each position.

Figure 5:
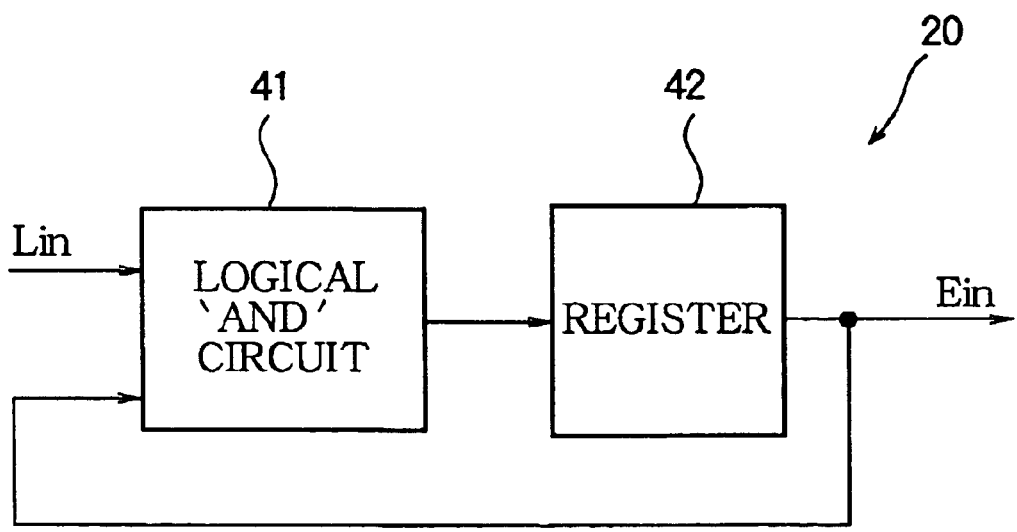
FIG. 5 is a block diagram illustrating the structure of a termination decision unit in the soft-output decoder according to the first embodiment of the invention.

FIG. 5 is a block diagram illustrating the structure of the termination decision unit 20 in FIG. 2. The termination decision unit 20 comprises a logical AND circuit 41 and a register 42. The logical AND circuit 41 receives the computation decision flag stream Jin as its first input, and the output of register 42 as its second input. Register 42 receives the output of logical AND circuit 41. When the entire computation decision flag stream Jin has been input to logical AND circuit 41, register 42 outputs a termination decision flag Ein.

The operation of the soft-output decoders 1 in the first embodiment will be described below, omitting descriptions of operations that are performed identically in the conventional soft-output decoder 501 (see FIG. 24).

The soft-decision decoding process performed by soft-output decoder 1 in the first embodiment is carried out on a data stream of length n (n being a positive integer), as in the conventional soft-output decoder 501 described above (FIG. 24). The a-priori information likelihood stream Lin input to soft-output decoder 1 gives an a-priori information likelihood at each decoding position in a data stream having a data length n.

Taking each position in turn, the computation decision unit 14 sequentially decides whether metric computations (branch metric computations, forward recursion state metric computations, backward recursion state metric computations) are needed, on the basis of the a-priori information likelihood, and generates a computation decision flag to indicate the result of this decision. The computation decision unit 14 writes the resulting computation decision flag stream Jin into the computation decision flag RAM 15, and also outputs the computation decision flag stream Jin to the branch metric computation unit 11 and termination decision unit 20.

In this embodiment, if it is decided that metric computations are needed, the computation decision flag for the corresponding position is cleared to '0'. If it is decided that metric computations are not needed, the computation decision flag is set to '1'.

In the computation decision unit 14 structured as shown in FIG. 4, comparator 35 compares the a-priori information likelihood with the prescribed decision threshold, and outputs the '0' or '1' computation decision flag according to the result of the comparison. That is, computation decision unit 14 decides whether further metric computations are needed at a given position by comparing the a-priori information likelihood with the prescribed decision threshold.

In the first soft-decision decoding process carried out by first soft-output decoder 1a in FIG. 1, the values of the a-priori information likelihood stream Lin are all '0' because the preceding soft-output decoder (the other soft-output decoder 1b) has not yet output an extrinsic information likelihood stream Leout. Therefore, in the first soft-decision decoding process, the computation decision unit 14 clears all the computation decision flags of the computation decision flag stream Jin to '0'. Alternatively, computation decision unit 14 does not operate in the first soft-decision decoding process.

For each position in the data stream, the branch metric computation unit 11 reads the corresponding computation decision flag from the computation decision flag RAM 15 and operates in accordance with the flag value as follows.

If the computation decision flag is cleared to '0', the branch metric computation unit 11 computes the branch metric values and information likelihood values at the corresponding position in the same way as the conventional branch metric computation unit 511 does (FIG. 24), and writes the resulting branch metric data and information likelihood data in the branch metric RAM 13 and likelihood RAM 12, respectively.

If the computation decision flag is set to '1', the branch metric computation unit 11 does not compute branch metric values or information likelihood values at the corresponding position and writes nothing in the branch metric RAM 13 and likelihood RAM 12. At this position, the branch metric RAM 13 and likelihood RAM 12 retain the branch metric and information likelihood values obtained in the preceding soft-decision decoding process performed by the same soft-output decoder, two iterations previously.

In the first soft-decision decoding iteration, since the initial values of the computation decision flags are all '0", the branch metric computation unit 11 operates like the conventional branch metric computation unit 511 (FIG. 24), sequentially computing branch metric values and information likelihood values at every position.

The forward recursion state metric computation unit 16f reads a computation decision flag from computation decision flag RAM 15 and operates in accordance with the value of the flag as follows.

Figure 23:
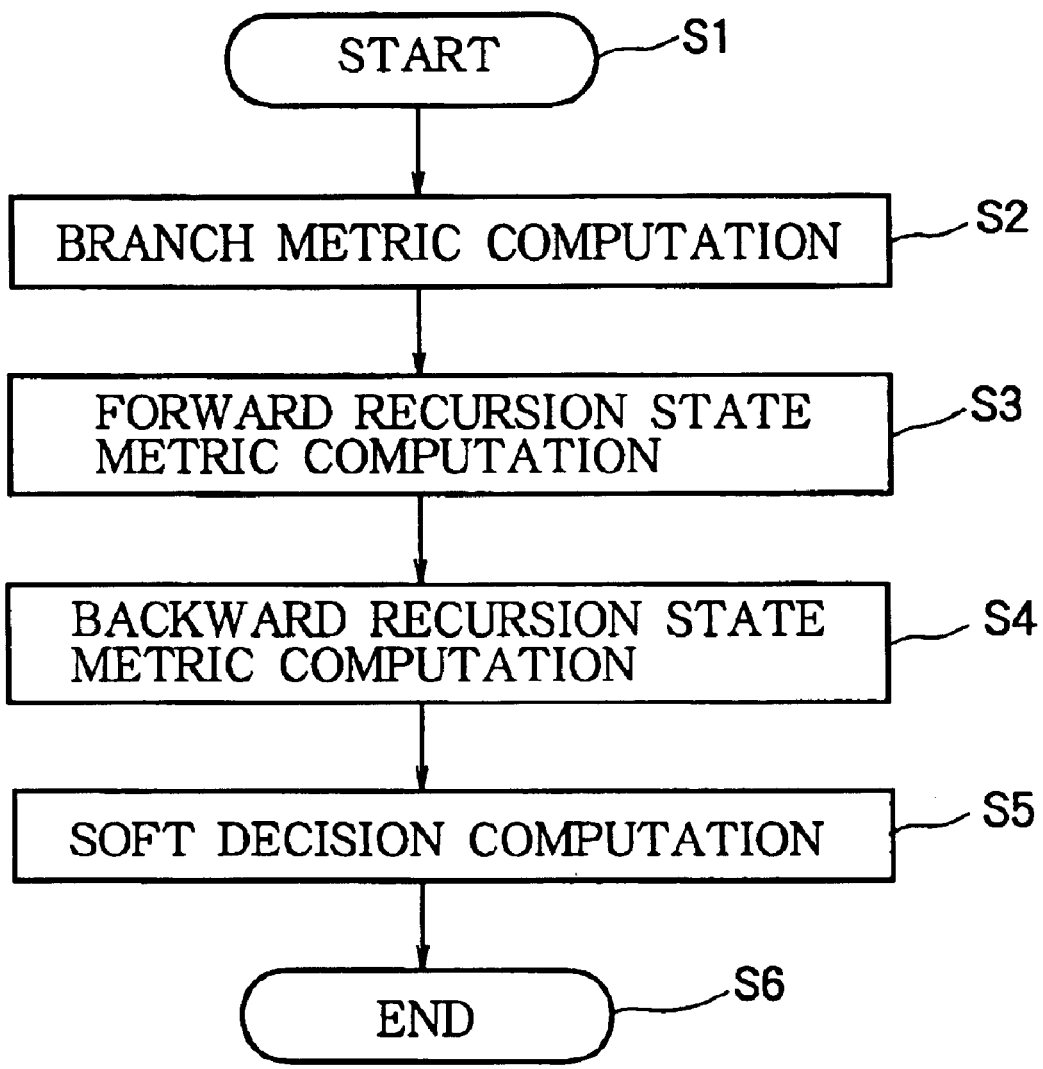
FIG. 23 is a flowchart illustrating the soft-decision decoding algorithm.

If the computation decision flag is set to '0', the forward recursion state metric computation unit 16f operates in the same way as the conventional forward recursion state metric computation unit 516f (FIG. 24): it reads necessary branch metric values from the branch metric RAM 13, uses the branch metric values to perform forward recursion state metric computations at the corresponding position (computations corresponding to step S3 in FIG. 23), and writes the resulting forward recursion state metric data in the forward recursion state metric RAM 17f.

If the computation decision flag is set to '1', the forward recursion state metric computation unit 16f does not perform forward recursion state metric computations at the corresponding position and does not write anything in the forward recursion state metric RAM 17f. Accordingly, the forward recursion state metric RAM 17f retains the forward recursion state metric values for the corresponding position obtained in the preceding soft-decision decoding process performed by the same soft-output decoder, two iterations previously.

The backward recursion state metric computation unit 16r reads a computation decision flag from computation decision flag RAM 15 and operates in accordance with the value of the flag as follows.

If the computation decision flag is set to '0', the backward recursion state metric computation unit 16r operates in the same way as the conventional backward recursion state metric computation unit 516r (FIG. 24): it reads necessary branch metric values from the branch metric RAM 13, uses the branch metric values to perform backward recursion state metric computations at the corresponding position, and writes the resulting backward recursion state metric values in the backward recursion state metric RAM 17r.

If the computation decision flag is set to '1', the backward recursion state metric computation unit 16r does not perform any backward recursion state metric computations at the corresponding position and does not write anything in the backward recursion state metric RAM 17r. Accordingly, the backward recursion state metric RAM 17r retains the backward recursion state metric values for the corresponding position obtained in the preceding soft-decision decoding process.

In the first soft-decision decoding iteration, since the computation decision flags are all '0', both state metric computation units 16f and 16r operate like the conventional state metric computation units 516f and 516r in FIG. 24, performing the forward recursion state metric computations and backward recursion state metric computations at all positions.

For each integer k from 1 to n, the forward recursion state metrics obtained at the k-th position are required in the forward recursion state metric computation at the (k+1)-th position, and the backward recursion state metrics obtained at the k-th position are required in the backward recursion state metric computation at the (k−1)-th position. If the state metric computations are not performed at the k-th position because the computation decision flag for that position is '1', then to perform the forward recursion state metric computation at the (k+1)-th position, the forward recursion state metric computation unit 16f reads the forward recursion state metric values for the k-th position obtained in a previous soft-decision decoding iteration from the forward recursion state metric RAM 17f, and to perform the backward recursion state metric computation at the (k−1)-th position, the backward recursion state metric computation unit 16r reads the backward recursion state metric values for the k-th position obtained in a previous soft-decision decoding iteration from the backward recursion state metric RAM 17r.

Suppose that there are four states and four state metric values for each position k. When the selector 26 in the state metric computation unit 16 in FIG. 3 (forward recursion state metric computation unit 16f or backward recursion state metric computation unit 16r in FIG. 2) receives the computation decision flag for the k-th position, the registers 27 hold the state metric values of the m-th states (m=1 to 4) at the (k−1)-th or (k+1)-th position.

If the computation decision flag for the k-th position is '0', then for each state m (m=1 to 4), state metric calculator 25 calculates the state metric value of the m-th state at the k-th position, using the state metric values of other states at the (k−1)-th or (k+1)-th position held in the registers 27 and the corresponding branch metric values read from the branch metric RAM 13 (FIG. 2). Selector 26 selects the state metric values obtained by state metric calculator 25 for the k-th position, and writes these state metric values both in the registers 27 and in the state metric RAM (forward recursion state metric RAM 17f or backward recursion state metric RAM 17r). The state metric values thus written in the registers 27 are used next in the state metric computations for the (k+1)-th or (k−1)-th position.

If the computation decision flag for the k-th position is '1', state metric calculator 25 does not perform any state metric computations. For each state m (m=1 to 4), selector 26 reads the state metric value of the m-th state at the k-th position from the state metric RAM, and writes this value in the corresponding register in the group of registers 27 without updating the state metric RAM. The state metric values written in the registers 27 are used next in the state metric computations for the (k+1)-th or (k−1)-th position, but these are now state metric values calculated by the state metric calculator 25 in a previous iteration of the soft-decision decoding process.

Figure 19:
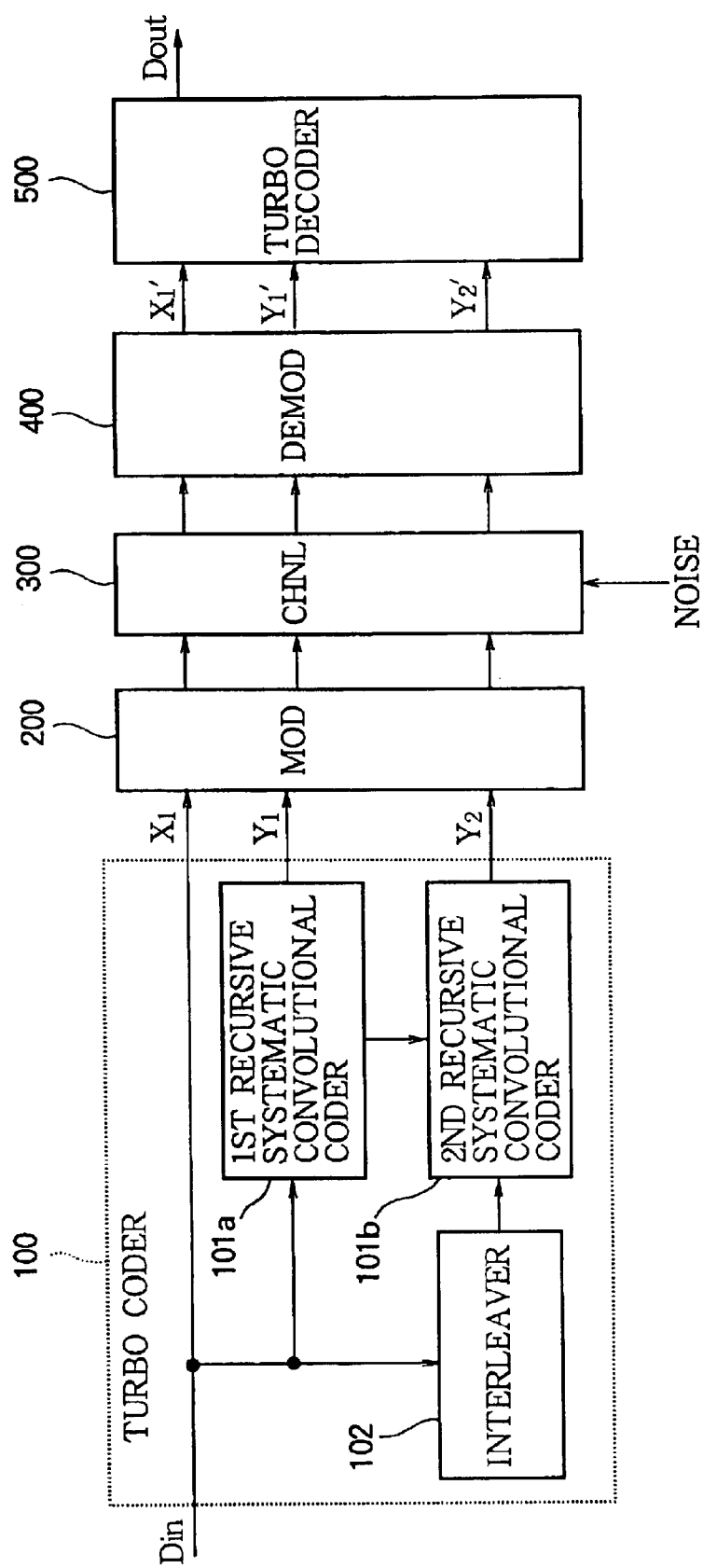
FIG. 19 shows the general structure of a turbo code transmission system and the structure of a turbo coder included in the system.
Figure 20:
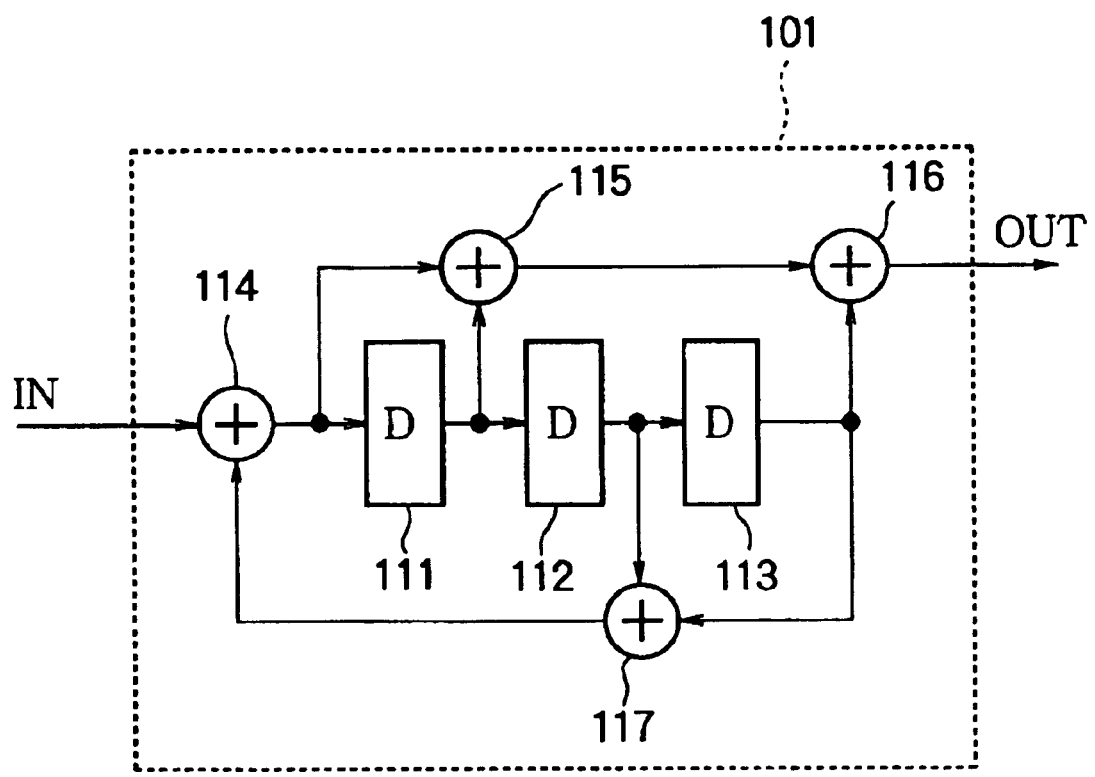
FIG. 20 shows the structure of a recursive systematic convolutional coder in the turbo coder.

The soft-decision computation unit 18 performs soft-decision computations for each position in the transmitted data stream $X_1$ (Din in FIG. 19), using the branch metrics, forward recursion state metrics, and backward recursion state metrics. For positions at which the computation decision flag is '1', the values of these metrics have not been updated since the preceding soft-decision decoding process, and the output soft-decision data value is the same as in the preceding soft-decision decoding process performed by this soft-output decoder, two iterations previously. In the soft-decision data stream Lout output from the soft-decision computation unit 18, the soft-decision data for positions where the computation decision flag is '0' have been obtained in the current soft-decision decoding process, and the soft-decision data for positions where the computation decision flag is '1' are the same as the data obtained two iterations ago.

The differential computation unit 19 generates extrinsic information likelihood values by using the soft-decision data and information likelihood. If the computation decision flag is '1', the soft-decision data and information likelihood value used to obtain the extrinsic information likelihood for the corresponding position have not been updated and are the same as in the preceding soft-decision decoding process performed by this soft-output decoder, two iterations previously. In the extrinsic information likelihood stream Leout output from the differential computation unit 19, the extrinsic information likelihood values for positions where the computation decision flag is '0' have been calculated in the current soft-decision decoding process, and the extrinsic information likelihood values for positions where the computation decision flag is '1' are the same as the likelihood values obtained two iterations ago.

The termination decision unit 20 decides whether the soft-decision decoding process can end, on the basis of the computation decision flag stream Jin input from computation decision unit 14, and outputs the termination decision flag Ein to indicate the result of the termination decision. In this embodiment, if it has been decided that the soft-decision decoding process cannot end, the termination decision flag Ein is cleared to '0'. Otherwise, the termination decision flag Ein is set to '1'.

When all the computation decision flags have been input, the termination decision unit 20 outputs the termination decision flag Ein from register 42. In the termination decision unit 20 structured as shown in FIG. 5, register 42 is initially set to '1'. If any of the input computation decision flags is '0', the termination decision flag Ein is cleared to '0'. If all of the input computation decision flags are '1', the termination decision flag Ein remains set to '1'.

Accordingly, if a computation decision flag for any position in the data stream is '0', the termination decision unit 20 shown in FIG. 5 decides that further soft-decision decoding is necessary and clears the termination decision flag Ein to '0'. If the computation decision flag is set to '1' for every position in the data stream, termination decision unit 20 decides that no further soft-decision decoding is necessary and sets the termination decision flag Ein to '1'.

In the soft-output decoder according to the first embodiment, unnecessary operation of the computation circuits can be avoided because the need for further metric computations at each decoding position in the data stream is decided according to the a-priori information likelihood. In addition, the soft-output decoder does not iterate the soft-decision decoding process a number of times predetermined according to the signal-to-noise ratio but can determine the number of iterations on the basis of the progress of the metric computations, depending on the received data stream. Accordingly, the overall processing time and power consumption of the turbo decoder can be reduced.

Second Embodiment

Figure 6:
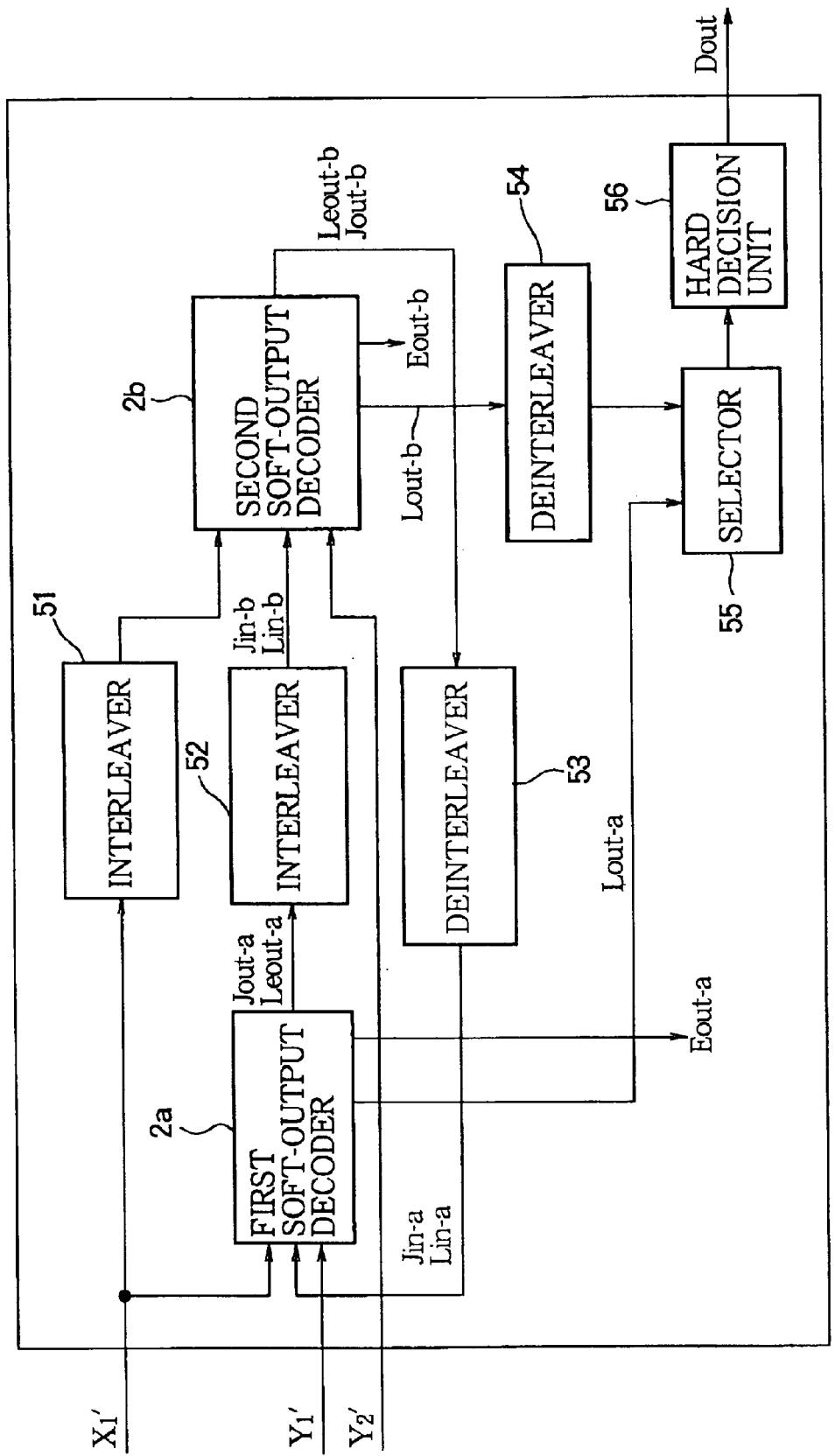
FIG. 6 is a block diagram illustrating the structure of a turbo decoder comprising a pair of soft-output decoders according to a second embodiment of the invention.

FIG. 6 is a block diagram illustrating the structure of a turbo decoder comprising a pair of soft-output decoders 2a, 2b according to a second embodiment of the invention, a pair of interleavers 51, 52, a pair of deinterleavers 53, 54, a selector 55, and a hard decision unit 56. The second embodiment is obtained from the first embodiment by replacing the soft-output decoders 1a, 1b in FIG. 1 with the soft-output decoders 2a, 2b in FIG. 6.

Soft-output decoder 2a outputs a soft-decision data stream Lout-a, an extrinsic information likelihood stream Leout-a, a termination decision flag Eout-a, and a next-stage computation decision flag stream Jout-a. Soft-output decoder 2b outputs a soft-decision data stream Lout-b, an extrinsic information likelihood stream Leout-b, a termination decision flag Eout-b, and a next-stage computation decision flag stream Jout-b.

Soft-output decoder 2a receives the (noisy) received data streams $X_1'$, $Y_1'$, the a-priori information likelihood stream Lin-a, and the a-priori computation decision flag stream Jin-a, which is output from deinterleaver 53 as a deinterleaved version of the next-stage computation decision flag stream Jout-b. Soft-output decoder 2b receives the (noisy) received data stream $X_1'$-interleaved output from interleaver 51, the (noisy) received data stream $Y_2'$, the a-priori information likelihood stream Lin-b, and the a-priori computation decision flag stream Jin-b, which is output from interleaver 52 as an interleaved version of the next-stage computation decision flag stream Jout-a.

Figure 22:
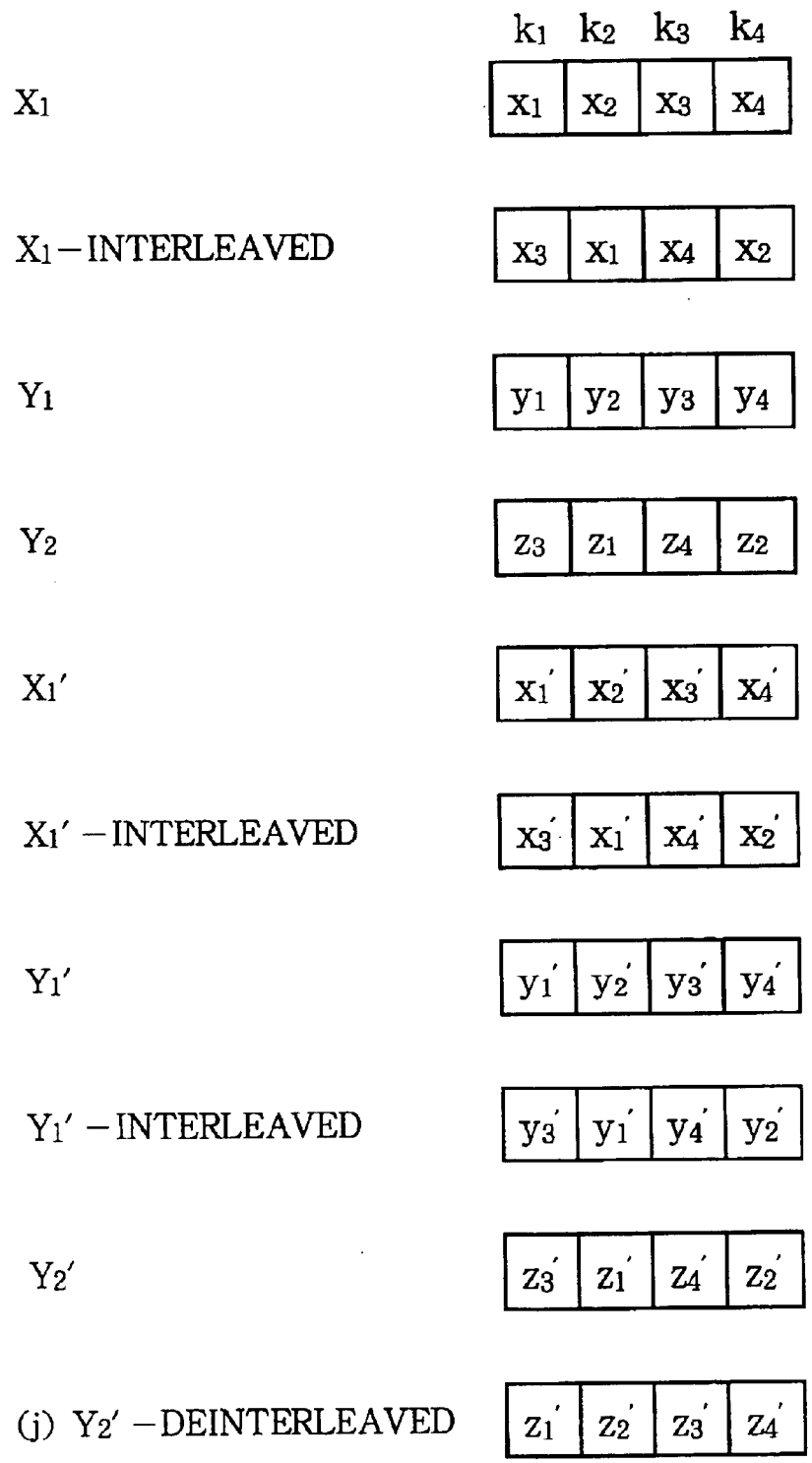
FIG. 22 illustrates the data sequences of data streams transmitted and received in the turbo code transmission system.

The data in the input and output data streams of the two soft-output decoders 2a, 2b are arranged in the same way as for the conventional soft-output decoders 501a, 501b, as partially illustrated in FIG. 22.

Figure 7:
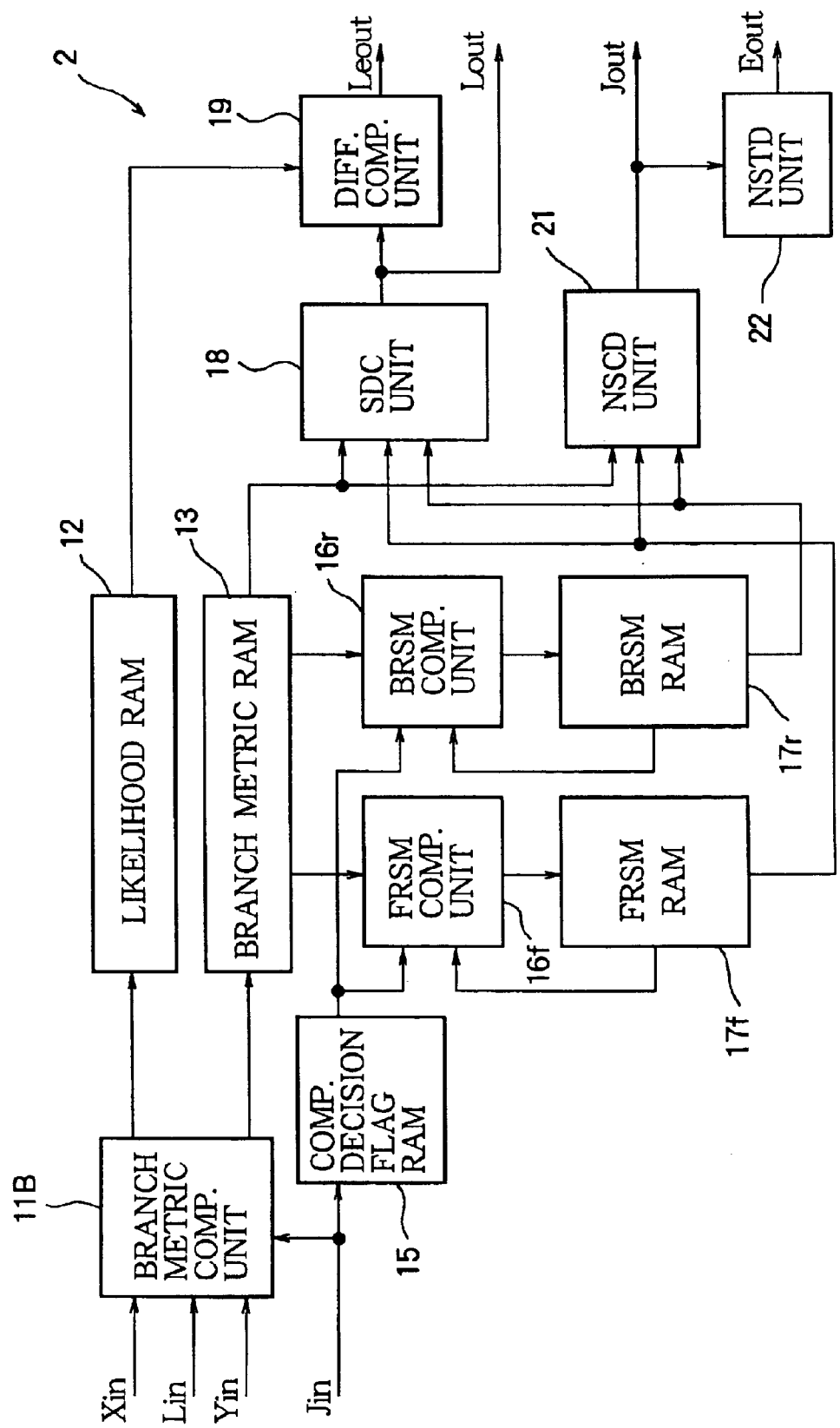
FIG. 7 is a block diagram illustrating the structure of a soft-output decoder according to the second embodiment of the invention.

FIG. 7 is a block diagram illustrating the structure of the soft-output decoder 2 (soft-output decoder 2a or soft-output decoder 2b in FIG. 6) according to the second embodiment of the invention. Jin represents the a-priori computation decision flag stream Jin-a or Jin-b in FIG. 6.

The soft-output decoder 2 in the second embodiment comprises a branch metric computation unit 11B, a likelihood RAM 12, a branch metric RAM 13, a computation decision flag RAM 15, a forward recursion state metric (FRSM) computation unit 16f, a backward recursion state metric (BRSM) computation unit 16r, a forward recursion state metric RAM 17f, a backward recursion state metric RAM 17r, a soft-decision computation unit 18, a differential computation unit 19, a next-stage computation decision (NSCD) unit 21, and a next-stage termination decision (NSTD) unit 22.

The second embodiment is obtained from the first embodiment by removing the computation decision unit 14 and termination decision unit 20 shown in FIG. 1, adding the next-stage computation decision unit 21 and next-stage termination decision unit 22, and replacing branch metric computation unit 11 with branch metric computation unit 11B.

Figure 8:
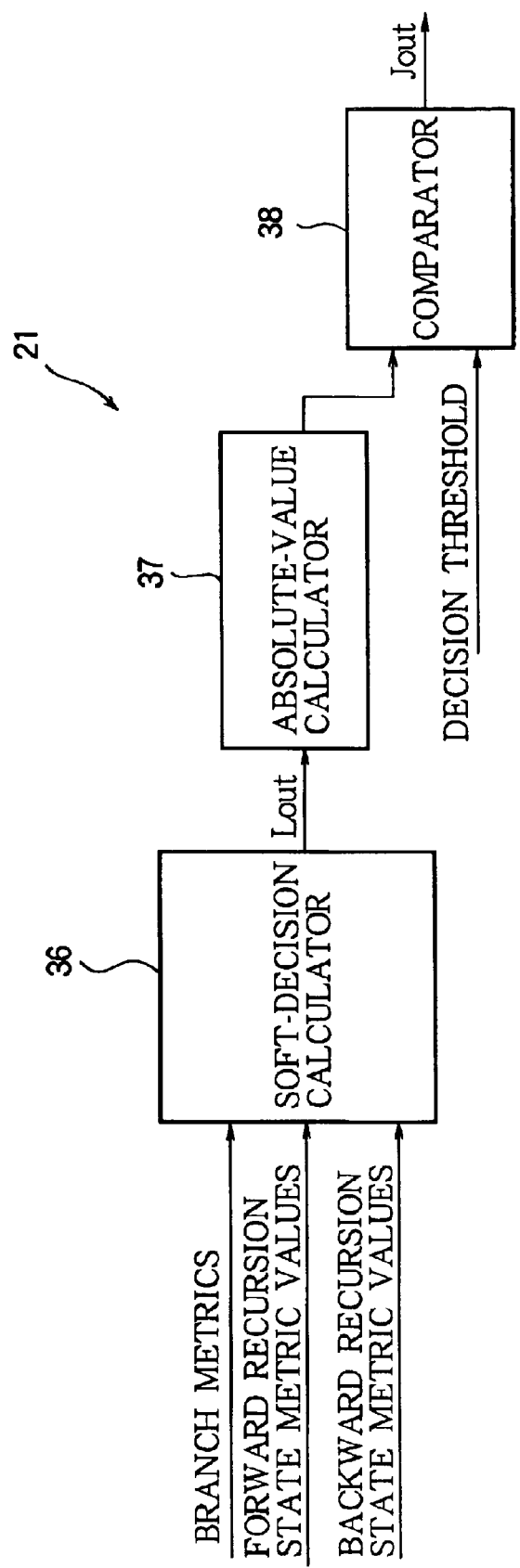
FIG. 8 is a block diagram illustrating the structure of a next-stage computation decision unit in the soft-output decoder according to the second embodiment of the invention.

FIG. 8 is a block diagram illustrating the structure of the next-stage computation decision unit 21 in soft-output decoder 2. The next-stage computation decision unit 21 comprises a soft-decision calculator 36, an absolute-value calculator 37, and a comparator 38. The soft-decision calculator 36 has the same structure as the soft-decision computation unit 18 in FIG. 7. The absolute-value calculator 37 receives sequential input of the soft-decision data stream Lout output from soft-decision calculator 36. The comparator 38 receives sequential input of the values output from absolute-value calculator 37, compares them with a prescribed decision threshold, and outputs a next-stage computation decision flag stream Jout comprising next-stage computation decision flags for individual positions in the data stream.

The operation of the soft-output decoder 2 in the second embodiment will be described below, omitting descriptions of operations that are performed identically in the soft-output decoder 1 in the first embodiment (see FIG. 2).

The a-priori computation decision flag stream Jin input to soft-output decoder 2 has the same structure as the computation decision flag stream Jin in the first embodiment. The a-priori computation decision flag stream Jin comprises a-priori computation decision flags indicating whether metric computations are needed at individual decoding positions in a data stream of data length n.

Branch metric computation unit 11B differs from the branch metric computation unit 11 in the first embodiment (FIG. 2) in that if the a-priori computation decision flag is '1' (signifying non-performance of branch metric computations), branch metric computation unit 11B writes computation halt information indicating that metric computations are not needed for the corresponding position in the branch metric RAM 13.

The next-stage computation decision unit 21 operates as follows in accordance with the computation halt information written in the branch metric RAM 13 after all of the state metric computations (forward recursion state metric computations and backward recursion state metric computations) have ended.

If computation halt information is not detected (the a-priori computation decision flag is '0' and the metric computations are performed), the next-stage computation decision unit 21 reads the branch metric values and forward and backward recursion state metric values necessary for the corresponding position from branch metric RAM 13, forward recursion state metric RAM 17f, and backward recursion state metric RAM 17r. Using these metric values, the next-stage computation decision unit 21 decides whether metric computations have to be performed at this position in the next soft-output decoder and outputs a next-stage computation decision flag to indicate the decision result.

The metrics read by the next-stage computation decision unit 21 may be used to calculate, for instance, the existence probability of each branch, these existence probabilities then being used to decide whether the next soft-output decoder has to perform metric computations at the corresponding position. If the calculated branch existence probabilities determine a unique path between the k-th position and the (k+1)-th or (k−1)-th position, consequently determining the hard-decision output (0 or 1) of the decoded data stream at the corresponding position, then further computations are not needed for the corresponding position.

If computation halt information is detected (the a-priori computation decision flag is '1' and metric computations are not performed), then the next-stage soft-output decoder does not need to perform metric computations at the corresponding position, and the next-stage computation decision unit 21 sets the next-stage computation decision flag to '1' to indicate this.

In this embodiment, if it has been decided that metric computations are needed in the next stage, the next-stage computation decision flag is cleared to '0'. If it has been decided that metric computations are not needed in the next stage, the next-stage computation decision flag is set to '1'.

The next-stage computation decision unit 21 sequentially decides whether the next-stage soft-output decoder has to perform metric computations at each decoding position, sequentially generates next-stage computation decision flags to indicate these decision results, and outputs the next-stage computation decision flag stream Jout.

In the next-stage computation decision unit 21 structured as shown in FIG. 8, soft-decision calculator 36 computes soft-decision data in the same way as in soft-decision computation unit 18; absolute-value calculator 37 computes the absolute value of the soft-decision data; and comparator 38 compares the absolute value of the soft-decision data with a prescribed decision threshold. If the absolute value of the soft-decision data is smaller than the prescribed decision threshold, the next-stage computation decision flag is cleared to '0'; if the absolute value of the soft-decision data is larger than the prescribed decision threshold, the next-stage computation decision flag is set to '1'. FIG. 8 illustrates the computation decision process for a position where computation halt information is not detected.

In other words, if computation halt information is not detected, next-stage computation decision unit 21 decides whether further metric computations for the corresponding position are needed according to the result of a comparison between the absolute value of the soft-decision data and the prescribed decision threshold.

The next-stage termination decision unit 22 decides whether the next-stage soft-output decoder can terminate the soft-decision decoding process, on the basis of the next-stage computation decision flag stream Jout input from next-stage computation decision unit 21, and outputs a next-stage termination decision flag Eout to indicate the resulting next-stage termination decision. In this embodiment, if it has been decided that the soft-decision decoding process cannot be terminated in the next stage, the next-stage, termination decision flag Eout is cleared to '0'. If it has been decided that the soft-decision decoding process can be terminated in the next stage, the next-stage termination decision flag Eout is set to '1'.

In one possible scheme, if the next-stage computation decision flag for any position in the data stream is '0' (if any computation decision flag in the next-stage computation decision flag stream Jout is '0'), next-stage termination decision unit 22 decides that further soft-decision decoding is necessary in the next stage, and clears the next-stage termination decision flag Eout to '0'; if the next-stage computation decision flag is '1' for every position in the data stream (if all computation decision flags in the next-stage computation decision flag stream Jout are '1'), next-stage termination decision unit 22 decides that further soft-decision decoding is not necessary in the next stage, and sets the next-stage termination decision flag Eout to '1'. The next-stage termination decision unit 22 of this embodiment can be obtained from the termination decision unit 20 in the first embodiment (FIG. 5) by replacing the first input of logical AND circuit 41 and the output of register 42 with the next-stage computation decision flag stream Jout and the next-stage termination decision flag Eout, respectively.

The second embodiment produces the same effect as the first embodiment. In addition, because the computation decisions for each soft-output decoding iteration are made in the preceding iteration, once it has been decided that metric computations are not needed at a given position in the data stream, this decision can be carried over from one iteration to the next, so that the decision computation does not have to be repeated at each iteration. Accordingly, the overall processing time and power consumption of the turbo decoder can be further reduced.

Third Embodiment

Figure 9:
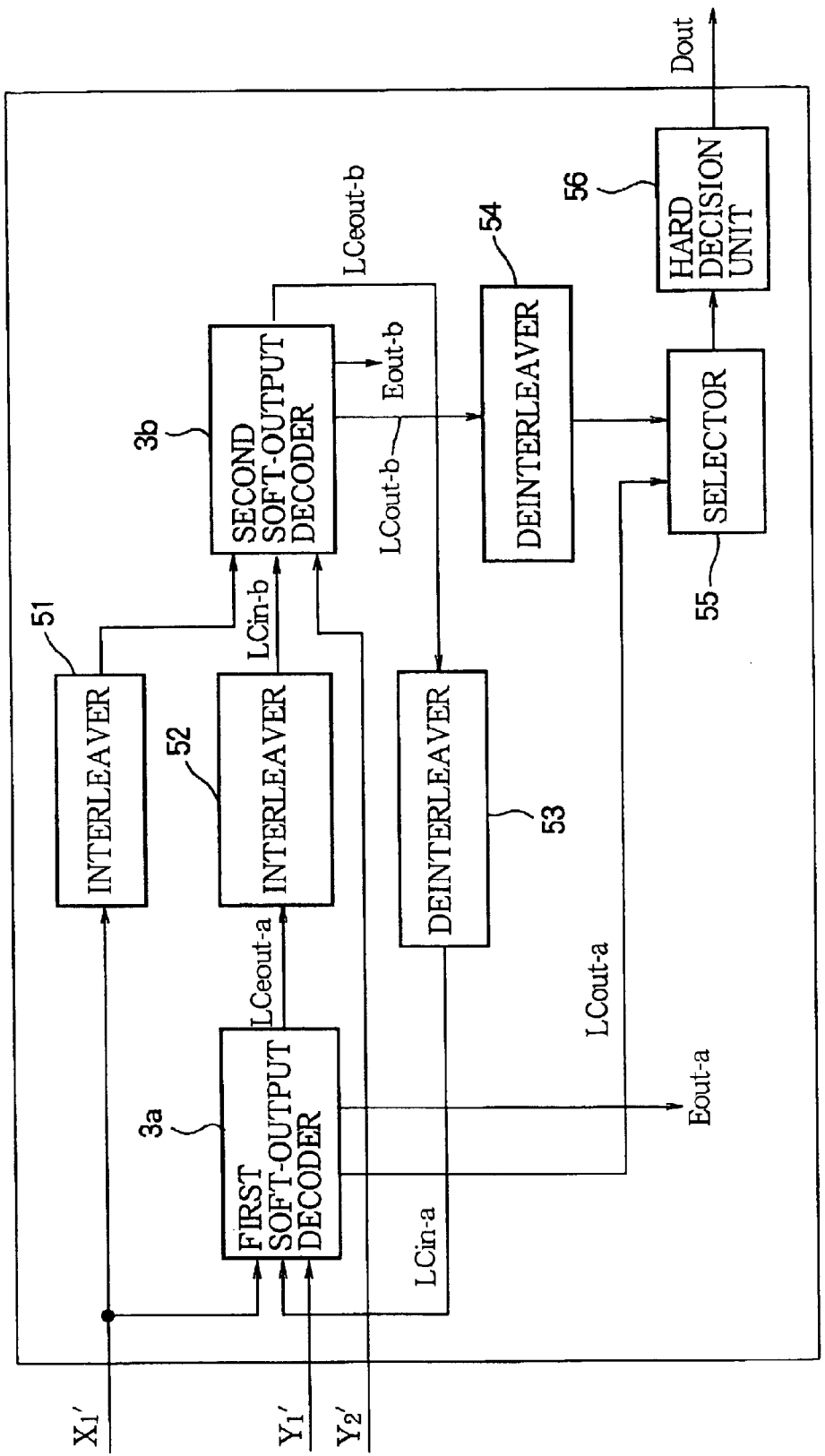
FIG. 9 is a block diagram illustrating the structure of a turbo decoder comprising a pair of soft-output decoders according to a third embodiment of the invention.

FIG. 9 is a block diagram illustrating the structure of a turbo decoder comprising a pair of soft-output decoders 3a, 3b according to a third embodiment of the invention, a pair of interleavers 51, 52, a pair of deinterleavers 53, 54, a selector 55, and a hard decision unit 56. The third embodiment is obtained from the first embodiment by replacing the soft-output decoders 1a, 1b in FIG. 1 with the soft-output decoders 3a, 3b in FIG. 9.

Soft-output decoder 3a outputs a soft-decision data stream LCout-a, a next-stage termination decision flag Eout-a, and an extrinsic information likelihood stream LCeout-a which replaces the extrinsic information likelihood stream Leout-a of the preceding embodiments. Soft-output decoder 3b outputs a soft-decision data stream LCout-b, a next-stage termination decision flag Eout-b, and an extrinsic information likelihood stream LCeout-b which replaces the extrinsic information likelihood stream Leout-b of the preceding embodiments.

Soft-output decoder 3a receives the (noisy) received data streams $X_1'$, $Y_1'$ and an a-priori information likelihood stream LCin-a which replaces the a-priori information likelihood stream Lin-a of the preceding embodiments. Soft-output decoder 3b receives the (noisy) received data stream $X_1'$-interleaved from interleaver 51, the (noisy) received data stream $Y_2'$, and the a-priori information likelihood stream LCin-b which replaces the a-priori information likelihood stream Lin-b of the preceding embodiments.

The data in the input and output data streams of the two soft-output decoders 3a, 3b are arranged in the same way as in the conventional soft-output decoders 501a, 501b, as partially illustrated in FIG. 22.

Figure 10:
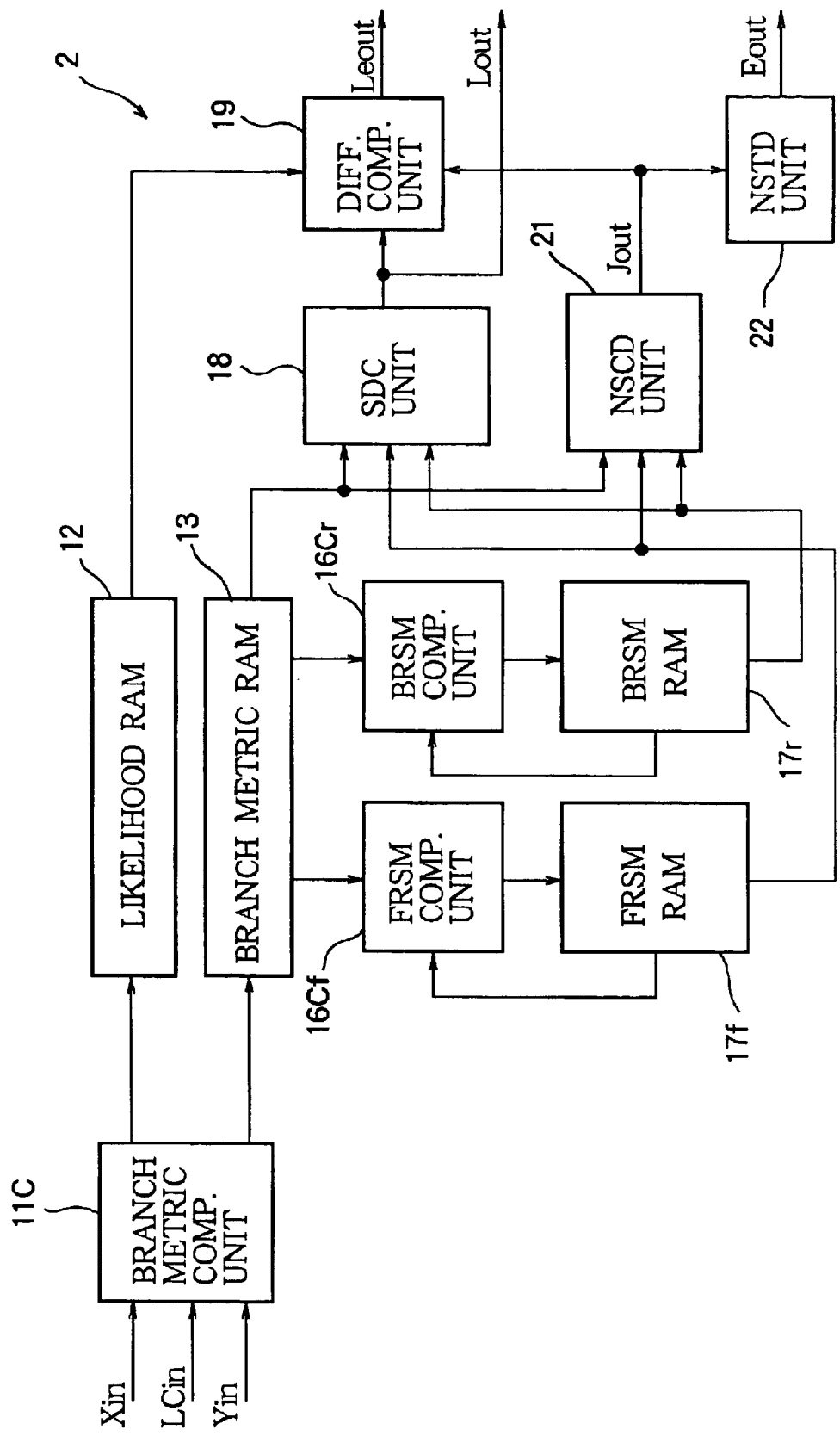
FIG. 10 is a block diagram illustrating the structure of a soft-output decoder according to the third embodiment of the invention.

FIG. 10 is a block diagram illustrating the structure of the soft-output decoder 3 (soft-output decoder 3a or soft-output decoder 3b in FIG. 9) according to the third embodiment of the invention. In the figure, LCin represents the a-priori information likelihood stream LCin-a or LCin-b in FIG. 9.

The soft-output decoder 3 in the third embodiment comprises a branch metric computation unit 11C, a likelihood RAM 12, a branch metric RAM 13, a computation decision flag RAM 15, a forward recursion state metric computation unit 16Cf, a backward recursion state metric computation unit 16Cr, a forward recursion state metric RAM 17f, a backward recursion state metric RAM 17r, a soft-decision computation unit 18, a differential computation unit 19C, a next-stage computation decision unit 21, and a next-stage termination decision unit 22.

The third embodiment is obtained from the second embodiment by replacing the branch metric computation unit 11B, forward recursion state metric computation unit 16f, backward recursion state metric computation unit 16r, and differential computation unit 19 shown in FIG. 7 with the branch metric computation unit 11C, forward recursion state metric computation unit 16Cf, backward recursion state metric computation unit 16Cr, and differential computation unit 19C, respectively, and eliminating the computation decision flag RAM 15.

The operation of the soft-output decoder 3 in the third embodiment will be described below, omitting descriptions of operations that are performed identically in the soft-output decoder 2 of the second embodiment (FIG. 7).

The soft-output decoder 3 of the third embodiment differs from the soft-output decoder 2 of the second embodiment (FIG. 7) in that the next-stage computation decision flags are embedded in the extrinsic information likelihood stream LCeout output to the next soft-output decoder (the other soft-output decoder), and the a-priori computation decision flags are embedded in the a-priori information likelihood stream LCin which the soft-output decoder 3 receives from the preceding-stage soft-output decoder (the other soft-output decoder in FIG. 9).

The differential computation unit 19C differs from the differential computation unit 19 of the first embodiment (FIG. 2) in the following points: the differential computation unit 19C performs differential extrinsic information likelihood computations only at positions where the next-stage computation decision flag obtained from the next-stage computation decision unit 22 is '0'; if the next-stage computation decision flag is '0', the differential computation unit 19C outputs the '0' flag value and the computed extrinsic information likelihood; if the next-stage computation decision flag is '1', the differential computation unit 19C simply outputs the '1' flag value. In either case, the next-stage computation decision flag is embedded in the extrinsic information likelihood stream LCeout.

The extrinsic information likelihood stream LCeout has a '0' flag and an extrinsic information likelihood value for each position where the next-stage computation decision flag is '0', and has a '1' flag for each position where the next-stage computation decision flag is '1'. The extrinsic information likelihood stream LCeout is interleaved or deinterleaved, then input to the next-stage soft-output decoder (the other soft-output decoder in FIG. 9) as the a-priori information likelihood stream LCin. The embedded next-stage computation decision flags are received as a-priori computation decision flags.

The branch metric computation unit 11C differs from the branch metric computation unit 11B in the second embodiment (FIG. 7) by detecting the a-priori computation decision flags from the input a-priori information likelihood stream LCin.

The soft-output decoder soft-output decoder 3 of the third embodiment has a branch metric RAM 13, into which the branch metric computation unit 11C writes computation halt information if the a-priori computation decision flag for the corresponding position is '1', as in the second embodiment, but does not have a computation decision flag RAM 15, because the a-priori computation decision flags are embedded in the input a-priori information likelihood stream LCin.

The forward recursion state metric computation unit 16Cf differs from the forward recursion state metric computation unit 16f of the first embodiment (FIG. 2) in that it operates according to the computation halt information written in the branch metric RAM 13. If computation halt information is not detected (the a-priori computation decision flag is '0'), the forward recursion state metric computation unit 16Cf performs forward recursion state metric computations at the corresponding position and writes the result in the forward recursion state metric RAM 17f. If computation halt information is detected (the a-priori computation decision flag is '1'), the forward recursion state metric computation unit 16Cf reads the forward recursion state metric values obtained in a previous soft-decision decoding iteration from the forward recursion state metric RAM 17f.

The backward recursion state metric computation unit 16Cr differs from the backward recursion state metric computation unit 16r of the first embodiment (FIG. 2) in the same way, by operating according to the computation halt information written in the branch metric RAM 13. If computation halt information is not detected (the a-priori computation decision flag is '0'), the backward recursion state metric computation unit 16Cr performs backward recursion state metric computations at the corresponding position and writes the result in the backward recursion state metric RAM 17r. If computation halt information is detected (the a-priori computation decision flag is '1'), the backward recursion state metric computation unit 16Cr reads the backward recursion state metric values obtained in a previous soft-decision decoding iteration from the backward recursion state metric RAM 17r.

The third embodiment produces the same effect as the second embodiment. In addition, because the next-stage computation decision flags are embedded in the extrinsic information likelihood stream, the third embodiment does not require a special signal line for transmitting the next-stage computation decision flags to the next soft-output decoder, a special RAM (computation decision flag RAM 15) for storing the input a-priori computation decision flags, or circuits for reading the a-priori computation decision flags from the special RAM. Accordingly, the circuit scale and power consumption can be reduced.

Fourth Embodiment

Figure 11:
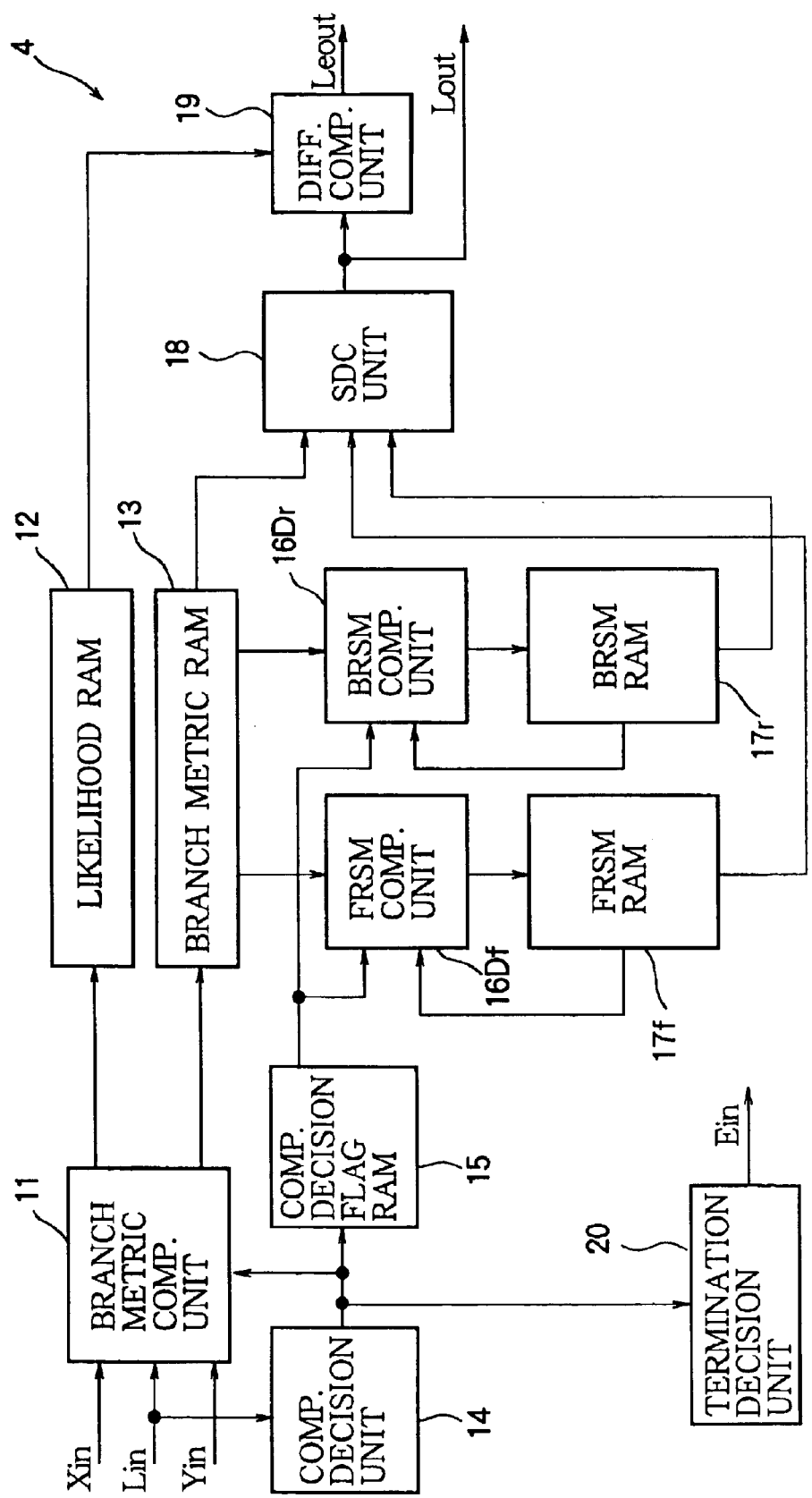
FIG. 11 is a block diagram illustrating the structure of a soft-output decoder according to a fourth embodiment of the invention.

FIG. 11 is a block diagram illustrating the structure of the soft-output decoders in the fourth embodiment of the invention. The turbo decoder of the fourth embodiment is obtained from the turbo decoder of the first embodiment by replacing each of the soft-output decoders 1a, 1b in FIG. 1 with the soft-output decoder 4 in FIG. 11.

The soft-output decoder 4 of the fourth embodiment comprises a branch metric computation unit 11, a likelihood RAM 12, a branch metric RAM 13, a computation (COMP.) decision unit 14, a computation decision flag RAM 15, a forward recursion state metric (FRSM) computation unit 16Df, a backward recursion state metric (BRSM) computation unit 16Dr, a forward recursion state metric RAM 17f, a backward recursion state metric RAM 17r, a soft-decision computation unit 18, a differential computation unit 19, and a termination decision unit 20. The fourth embodiment is thus obtained from the first embodiment by replacing the state metric computation units 16f and 16r in FIG. 2 with state metric computation units 16Df and 16Dr, respectively.

Figure 12:
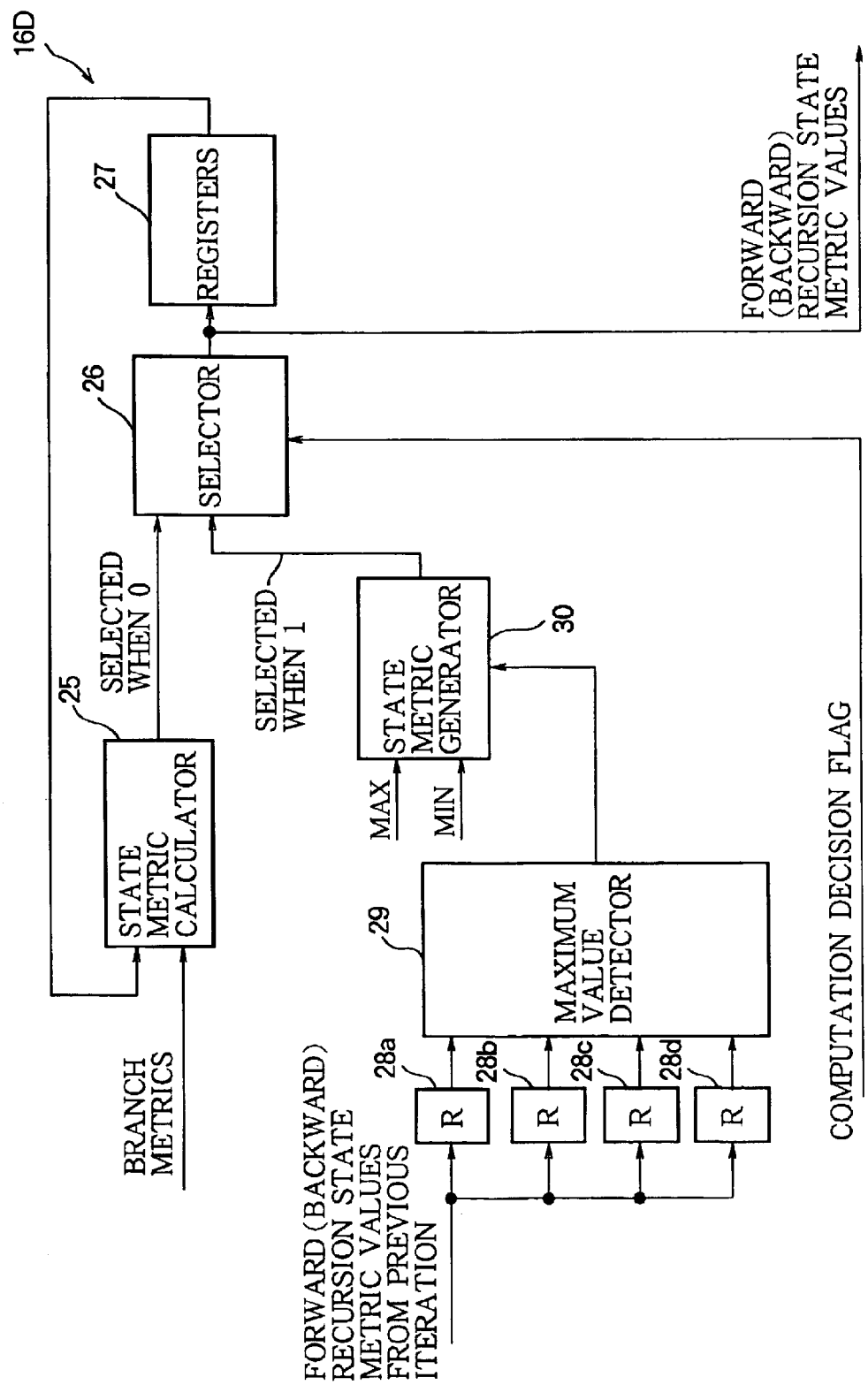
FIG. 12 is a block diagram illustrating the structure of a state metric computation unit in the soft-output decoder according to the fourth embodiment of the invention.

FIG. 12 is a block diagram illustrating the structure of the state metric computation unit 16D (forward recursion state metric computation unit 16Df or backward recursion state metric computation unit 16Dr) in soft-output decoder 4. The state metric computation unit 16D in the fourth embodiment comprises a state metric calculator 25, a selector 26, registers 27, 28a, 28b, 28c, 28d, a maximum-value detector 29, and a state metric generator 30, and differs from state metric computation unit 16 of the first embodiment (FIG. 3) in that the additional registers 28a, 28b, 28c, 28d, maximum-value detector 29, and state metric generator 30 are provided.

The operation of the state metric computation unit 16D in the fourth embodiment will be described below. It will be assumed that there are four states in FIG. 12, as in FIG. 3.

If the computation decision flag for the k-th position is '0', the state metric computation unit 16D operates in the same way as the state metric computation unit 16 in the first embodiment (FIG. 3). Selector 26 selects the state metric value of the m-th state at the k-th position as output from state metric calculator 25 and writes it both in one of the registers 27 and in the state metric RAM (forward recursion state metric RAM 17f or backward recursion state metric RAM 17r).

If the computation decision flag for the k-th position is '1', selector 26 selects the state metric value of the m-th state at the k-th position as output from state metric generator 30 and writes it in one of the registers 27.

If the computation decision flag for the k-th position is '1', registers 28a to 28d hold the state metric values at the k-th position read from the state metric RAM, which have been obtained in a previous iteration of the soft-decision decoding process. Because the number of states is assumed to be four, the state metric computation unit 16D shown in FIG. 12 has four registers to hold the state metric values read from the state metric RAM.

If the computation decision flag for the k-th position is '1', the maximum-value detector 29 compares the separate state metric values held in registers 28a to 28d, detects the state with the highest existence probability in the preceding soft-decision decoding process, and outputs the detected state to the state metric generator 30. If the detected state is the m-th state, the state metric generator 30 outputs the maximum permissible state metric value to the selector 26 for the m-th state at the k-th position, and outputs the minimum permissible state metric value to the selector 26 for the other states at the k-th position.

Therefore, if the computation decision flag for the k-th position is '1', then instead of computing state metrics for the k-th position in the conventional way, and instead of simply using the state metric values from a previous soft-decision decoding iteration as in the preceding embodiments, the state metric computation unit 16 outputs the maximum permissible state metric value for the state that had the highest existence probability at the k-th position in the preceding iteration, and outputs the minimum permissible state metric value for the other states.

The fourth embodiment produces the same effect as the first embodiment. In addition, since the state metric value of each state for a position where the computation decision flag is '1' is the maximum or minimum permissible state metric value, depending on the state existence probabilities in the previous soft-decision decoding process performed by the same soft-decision decoder, and since these maximum or minimum permissible state metric values are used for the state metric computations at the next position, the state and branch values converge faster than in the first embodiment, and the number of iterations of the soft-decision decoding process can be reduced.

The state metric computation unit 16D of the fourth embodiment can also be used in the second or third embodiment.

Fifth Embodiment

Figure 13:
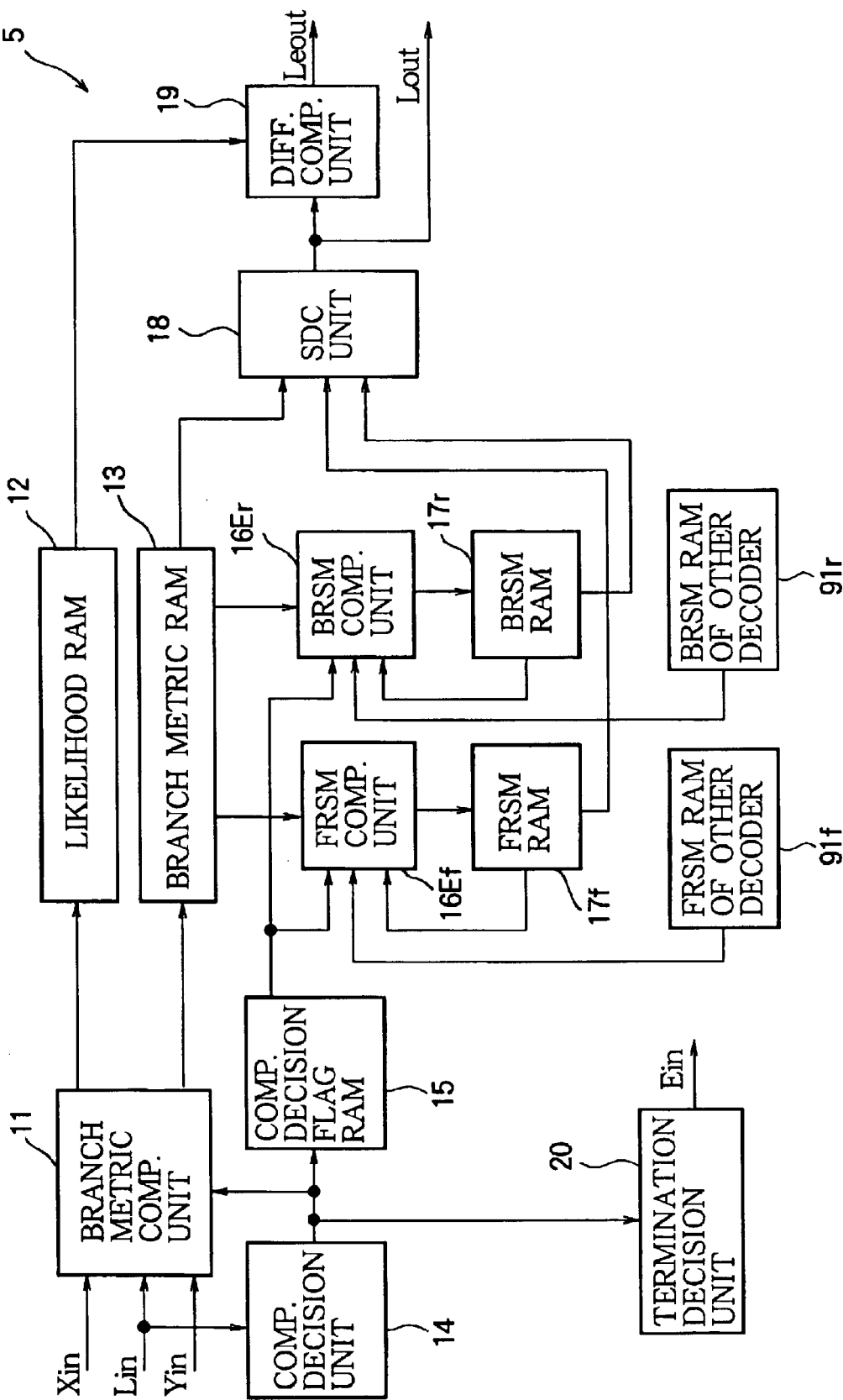
FIG. 13 is a block diagram illustrating the structure of a soft-output decoder according to a fifth embodiment of the invention.

FIG. 13 is a block diagram illustrating the structure of a soft-output decoder 5 in the fifth embodiment of the invention, also showing the forward recursion state metric RAM 91f and backward recursion state metric RAM 91r of the other soft-output decoder. The turbo decoder of the fifth embodiment is obtained from the turbo decoder of the first embodiment by replacing each of the soft-output decoders 1a, 1b in FIG. 1 with the soft-output decoder 5 in FIG. 13.

The soft-output decoder 5 of the fifth embodiment comprises a branch metric computation unit 11, a likelihood RAM 12, a branch metric RAM 13, a computation decision unit 14, a computation decision flag RAM 15, a forward recursion state metric computation unit 16Ef, a backward recursion state metric computation unit 16Er, a forward recursion state metric RAM 17f, a backward recursion state metric RAM 17r, a soft-decision computation unit 18, and a differential computation unit 19. The fifth embodiment is thus obtained from the first embodiment by replacing the state metric computation units 16f and 16r in FIG. 2 with state metric computation units 16Ef and 16Er, respectively.

Figure 14:
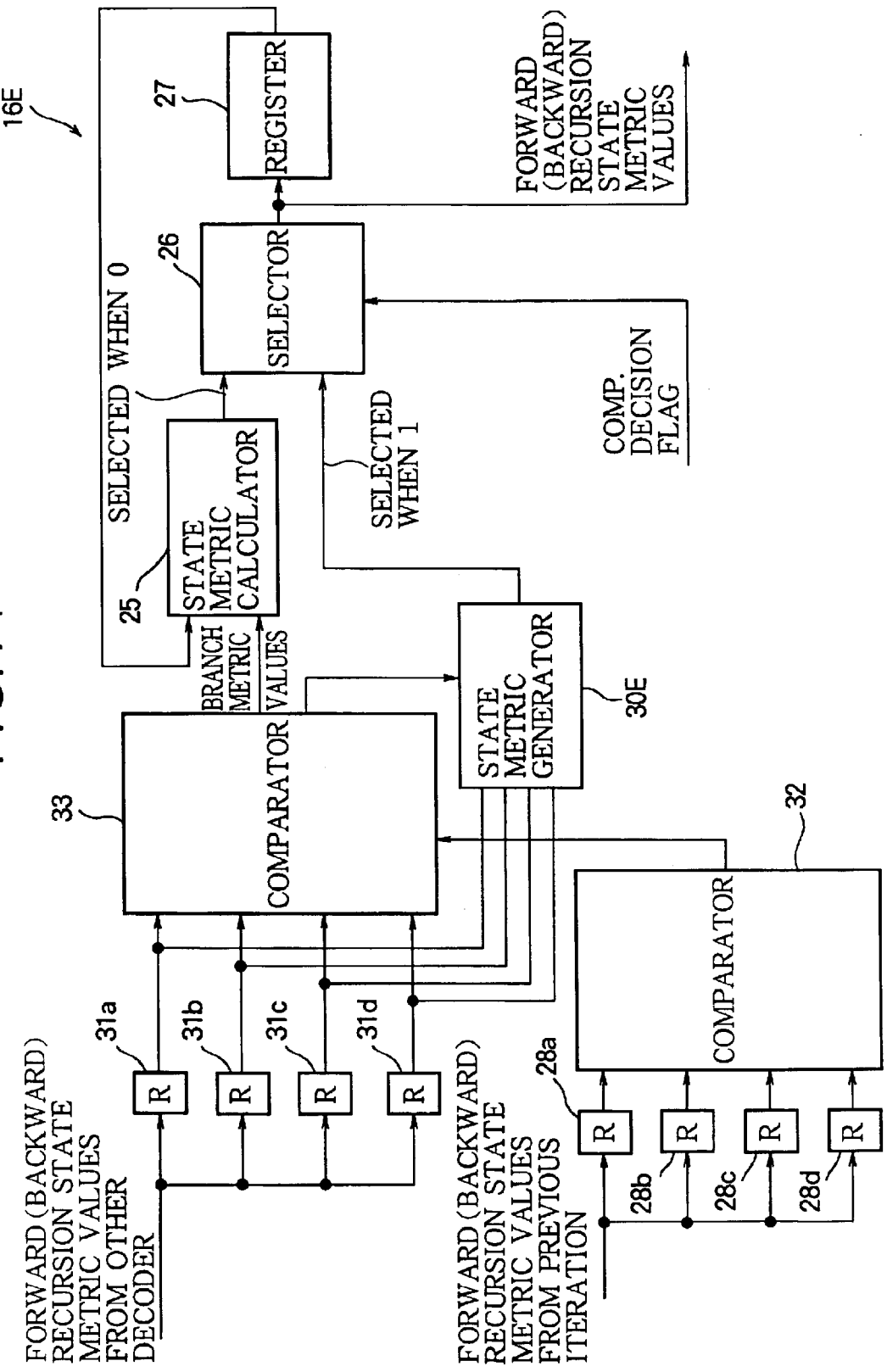
FIG. 14 is a block diagram illustrating the structure of a state metric computation unit in the soft-output decoder according to the fifth embodiment of the invention.

FIG. 14 is a block diagram illustrating the structure of a state metric computation unit 16E (forward recursion state metric computation unit 16Ef or backward recursion state metric computation unit 16Er) in the soft-output decoder 5. The state metric computation unit 16E in the fifth embodiment comprises a state metric calculator 25, a selector 26, registers 27, 28a, 28b, 28c, 28d, 31a, 31b, 31c, 31d, a state metric generator 30E, and comparators 32, 33.

The state metric computation unit 16E in the fifth embodiment is obtained from the state metric computation unit 16D in the fourth embodiment by removing the maximum-value detector 29 in FIG. 12, adding registers 31a to 31d and comparators 32, 33, and replacing the state metric generator 30 with the state metric generator 30E.

The operation of the state metric computation unit 16E in the fifth embodiment will be described below. It will be assumed that there are four states in FIG. 14, as in FIG. 12.

If the computation decision flag for the k-th position is '0', the state metric computation unit 16E operates in the same way as the state metric computation unit 16D in the second embodiment (FIG. 12). Selector 26 selects the state metric value of the m-th state at the k-th position output from state metric calculator 25 and writes it both in one of the registers 27 and in the state metric RAM (forward recursion state metric RAM 17f or backward recursion state metric RAM 17r).

If the computation decision flag for the k-th position is '1', selector 26 selects the state metric value of the m-th state at the k-th position output from the state metric generator 30E and writes it in one of the registers 27.

Registers 31a to 31d hold the state metric values read from the state metric RAM (forward recursion state metric RAM 91f or backward recursion state metric RAM 91r) of the other soft-output decoder. Because the number of states is assumed to be four, the state metric computation unit 16E shown in FIG. 14 has four registers to hold the state metric values obtained from the other soft-output decoder.

If the computation decision flag for the k-th position is '1', comparator 32 compares the separate state metric values of the preceding soft-decision decoding process held in registers 28a to 28d, detects the rank of the existence probability of the m-th state at the k-th position in the preceding soft-decision decoding process performed by the same soft-output decoder, and outputs the result to comparator 33.

Upon receiving the result, comparator 33 compares the separate state metric values obtained from the other soft-output decoder and held in registers 31a to 31d, finds the value having the same existence probability rank as detected by comparator 32 for the m-th state in the preceding soft-decision decoding process, and outputs the result to the state metric generator 30E.

The state metric generator 30E selects the state metric value detected by comparator 33 (this value may be held in any one of registers 31a to 31d) as the state metric value of the m-th state at the k-th position in the current decoding process, and outputs it to the selector 26.

Therefore, if state metric computations are not performed for the k-th position in the current iteration because the computation decision flag for the k-th position is '1', the m-th register in the group of registers 27 holds the state metric value obtained by the other soft output-decoder with the same existence probability rank as the state metric value obtained for the m-th state at the k-th position in the preceding soft-decision decoding process performed by the soft-output decoder 5 that is now performing the current iteration.

Suppose that the state metrics of the first, second, third, and fourth states of the other soft-output decoder are written respectively in registers 28a, 28b, 28c, and 28d, and that the state metrics of the first, second, third, and fourth states of the preceding soft-decision decoding process are written respectively in registers 31a, 31b, 31c, 31d, for instance. If the computation decision flag is '1', to generate a metric for the second state, comparator 32 ranks the existence probabilities of the separate state metric values held in registers 28a to 28d (obtained by the same soft-output decoder in a previous iteration of the soft-decision decoding process) and detects the ranking of the existence probability of the second state, which is held in the register 28b; comparator 33 finds which one of the four values held in registers 31a to 31d has the same ranking; and the state metric generator 30E selects that value as the state metric value of the second state in the current iteration.

If the values of the four states two iterations ago, held in registers 28a, 28b, 28c, 28d, are 100, 150, 250, 350 respectively, the value of the second state, held in register 28b, ranks third highest. If the values of the four states obtained by the other soft-output decoder one iteration ago, held in registers 31a, 31b, 31c, and 31d, are 100, 200, 300, and 400 respectively, the third-highest ranking value is 200. Therefore, the state metric generator 30E selects this value (200) as the state metric value of the second state for the current iteration and writes it in the corresponding register in the group of registers 27.

The fifth embodiment produces the same effect as the first embodiment. In addition, for a position where the state metric computation decision flag is '1', the state metric computation unit maintains its previous ranking of the existence probabilities of the states at this position, but borrows the more recent state metrics obtained by the other soft-output decoder at this position, and uses the borrowed state metrics for the state metric computations at the next position. Accordingly, each soft-output decoder obtains not only a-priori information likelihood values but also state metric values from the other soft-output decoder, which speeds up the convergence of the state and branch metric computations, so that the number of iterations of the soft-decision decoding process can be reduced.

The state metric computation unit 16E of the fifth embodiment can also be used in the second or third embodiment.

Sixth Embodiment

Figure 15:
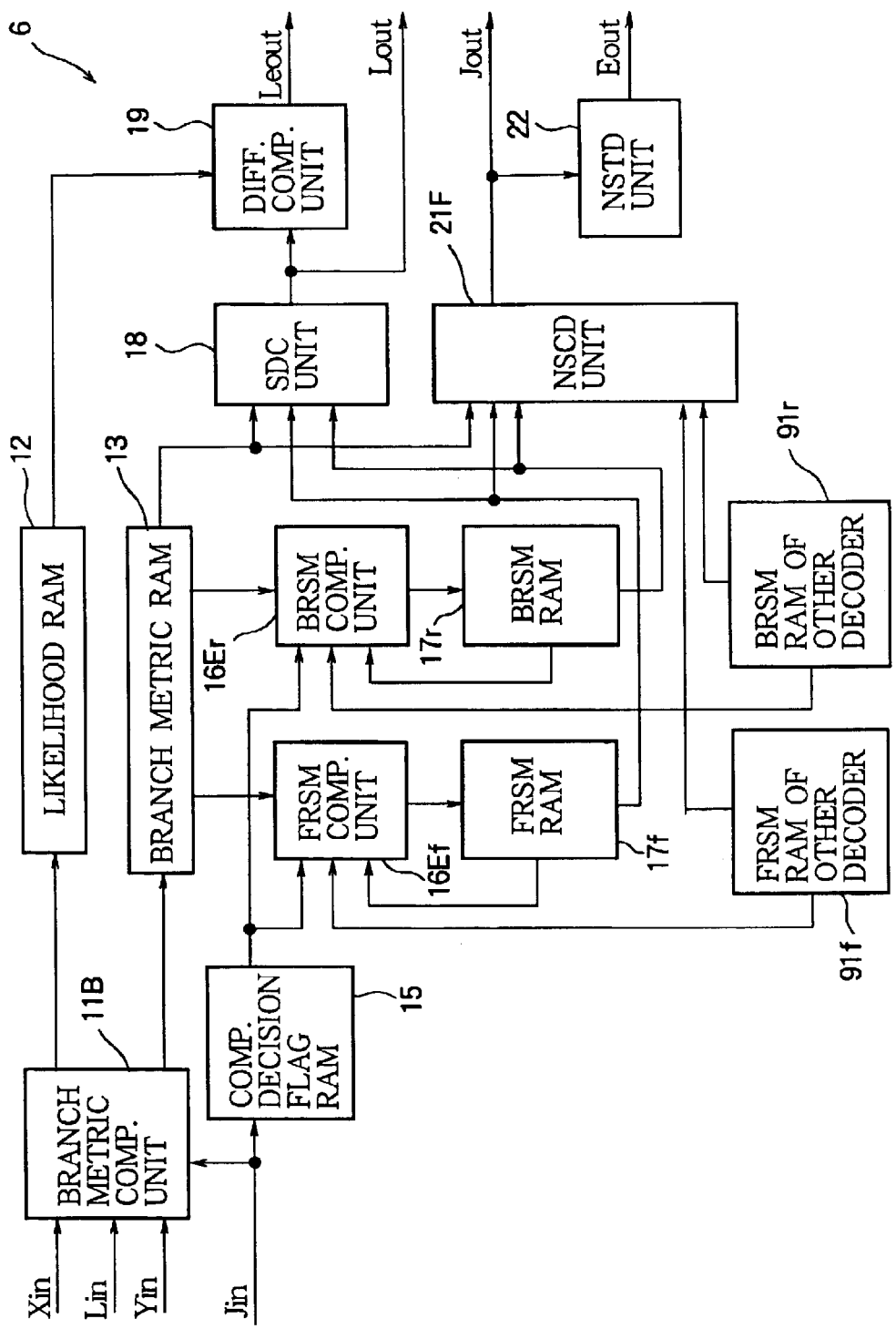
FIG. 15 is a block diagram illustrating the structure of a soft-output decoder according to a sixth embodiment of the invention.

FIG. 15 is a block diagram illustrating the structure of the soft-output decoders in the sixth embodiment of the invention. The turbo decoder of the sixth embodiment is obtained from the turbo decoder of the second embodiment by replacing each of the soft-output decoders 2a, 2b in FIG. 6 with the soft-output decoder 6 in FIG. 15.

The soft-output decoder 6 of the sixth embodiment comprises a branch metric computation (COMP.) unit 11B, a likelihood RAM 12, a branch metric RAM 13, a computation decision flag RAM 15, a forward recursion state metric (FRSM) computation unit 16Ef, a backward recursion state metric (BRSM) computation unit 16Er, a forward recursion state metric RAM 17f, a backward recursion state metric RAM 17r, a soft-decision computation (SDC) unit 18, a differential (DIFF.) computation unit 19, a next-stage computation decision (NSDC) unit 21F, and a next-stage termination decision (NSTD) unit 22. The sixth embodiment is thus obtained from the second embodiment by replacing the state metric computation units 16f, 16r and next-stage computation decision unit 21 in FIG. 7 with the state metric computation units 16Ef, 16Er and next-stage computation decision unit 21F respectively.

Figure 16:
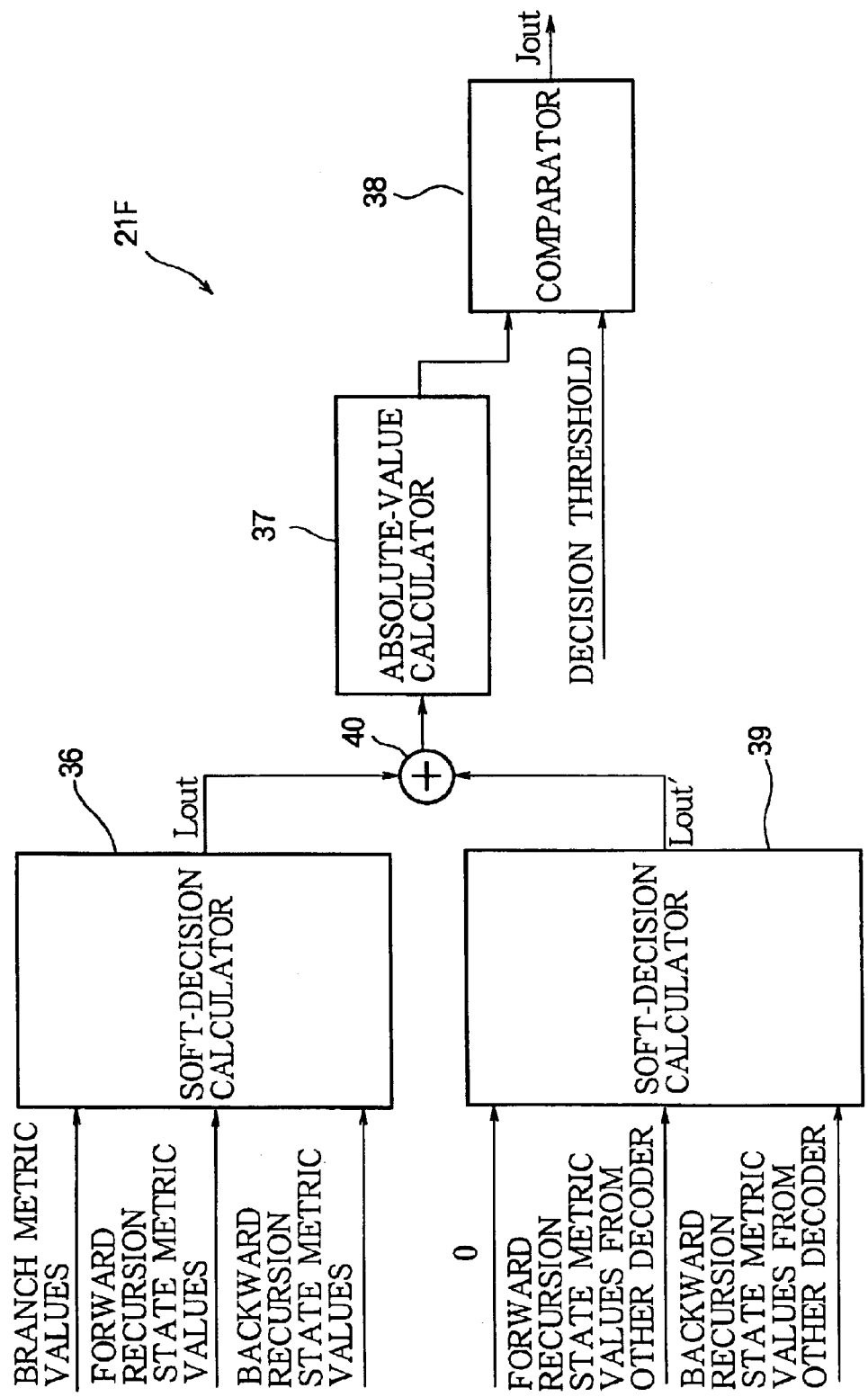
FIG. 16 is a block diagram illustrating the structure of a next-stage computation decision unit in the soft-output decoder according to the sixth embodiment of the invention.

FIG. 16 is a block diagram illustrating the structure of the next-stage computation decision unit 21F in soft-output decoder 6. The next-stage computation decision unit 21F comprises soft-decision calculators 36, 39, an absolute-value calculator 37, a comparator 38, and an adder 40, differing from next-stage computation decision unit 21 of the second embodiment (FIG. 8) in the provision of the soft-decision calculator 39 and adder 40.

The soft-decision calculators 36, 39 shown in FIG. 16 have the same structure as the soft-decision computation unit 18 in FIG. 15. Soft-decision calculator 36 receives the branch metric values, forward recursion state metric values, and backward recursion state metric values obtained by the same soft-output decoder 6. Soft-decision calculator 39 receives the forward recursion state metric values and backward recursion state metric values obtained by the other soft-output decoder in the turbo decoder. The outputs of soft-decision calculator 36 and soft-decision calculator 39 are added by adder 40, and the sum is input to the absolute-value calculator 37.

Like the next-stage computation decision unit 21 in the second embodiment (FIG. 7), the next-stage computation decision unit 21F in the sixth embodiment reads branch metric values, forward recursion state metric values, and backward recursion state metric values for a position where computation halt information is not detected (the a-priori computation decision flag is set to '0' and metric computations are performed) from the branch metric RAM 13, forward recursion state metric RAM 17f, and backward recursion state metric RAM 17r, respectively. Next-stage computation decision unit 21F differs from next-stage computation decision unit 21 by also reading the forward recursion and backward recursion state metric values obtained for the corresponding position by the other soft-output decoder, these values being read from the forward recursion state metric RAM 91f and backward recursion state metric RAM 91r. Using these metrics, the next-stage computation decision unit 21F decides whether metric computations have to be performed at this position in the next soft-output decoder and outputs a next-stage computation decision flag to indicate the decision result.

In the next-stage computation decision unit 21F structured as shown in FIG. 16, soft-decision calculator 36 computes soft-decision data in the same way as in soft-decision computation unit 18; soft-decision calculator 39 computes soft-decision data of the other soft-output decoder, using the forward recursion state metrics and backward recursion state metrics obtained from the other soft-output decoder. The branch metric values input to soft-decision calculator 39 are all '0'.

Adder 40 adds the soft-decision data for corresponding positions in the soft-decision data streams Lout and Lout' output from the two soft-output decoders, as obtained from soft-decision calculator 36 for the instant soft-decision decoder and from soft-decision calculator 39 for the other soft-output decoder, and absolute-value calculator 37 computes the absolute value of the resulting sum.

Comparator 38 compares the absolute value of the sum with a prescribed decision threshold. If the absolute value is smaller than the prescribed decision threshold, the computation decision flag is cleared to '0'; if the absolute value is larger than the prescribed decision threshold, the computation decision flag is set to '1'.

FIG. 16 illustrates the computation decision process for a position where computation halt information is not detected. If computation halt information is not detected, accordingly, the next-stage computation decision unit 21F decides whether further metric computations for the corresponding position are needed according to the soft-decision data obtained by both soft-output decoders. If computation halt information is detected, the next-stage computation decision unit 21F sets the computation decision flag to '1' as in the second embodiment.

The sixth embodiment produces the same effect as the second embodiment. In addition, because the state metrics of the other soft-output decoder are used to make next-stage computation decisions, the accuracy of the next-stage computation decision is improved, enabling the other soft-output decoder to identify states and branches more quickly. The number of iterations of the soft-decision decoding process can be reduced.

Seventh Embodiment

Figure 17:
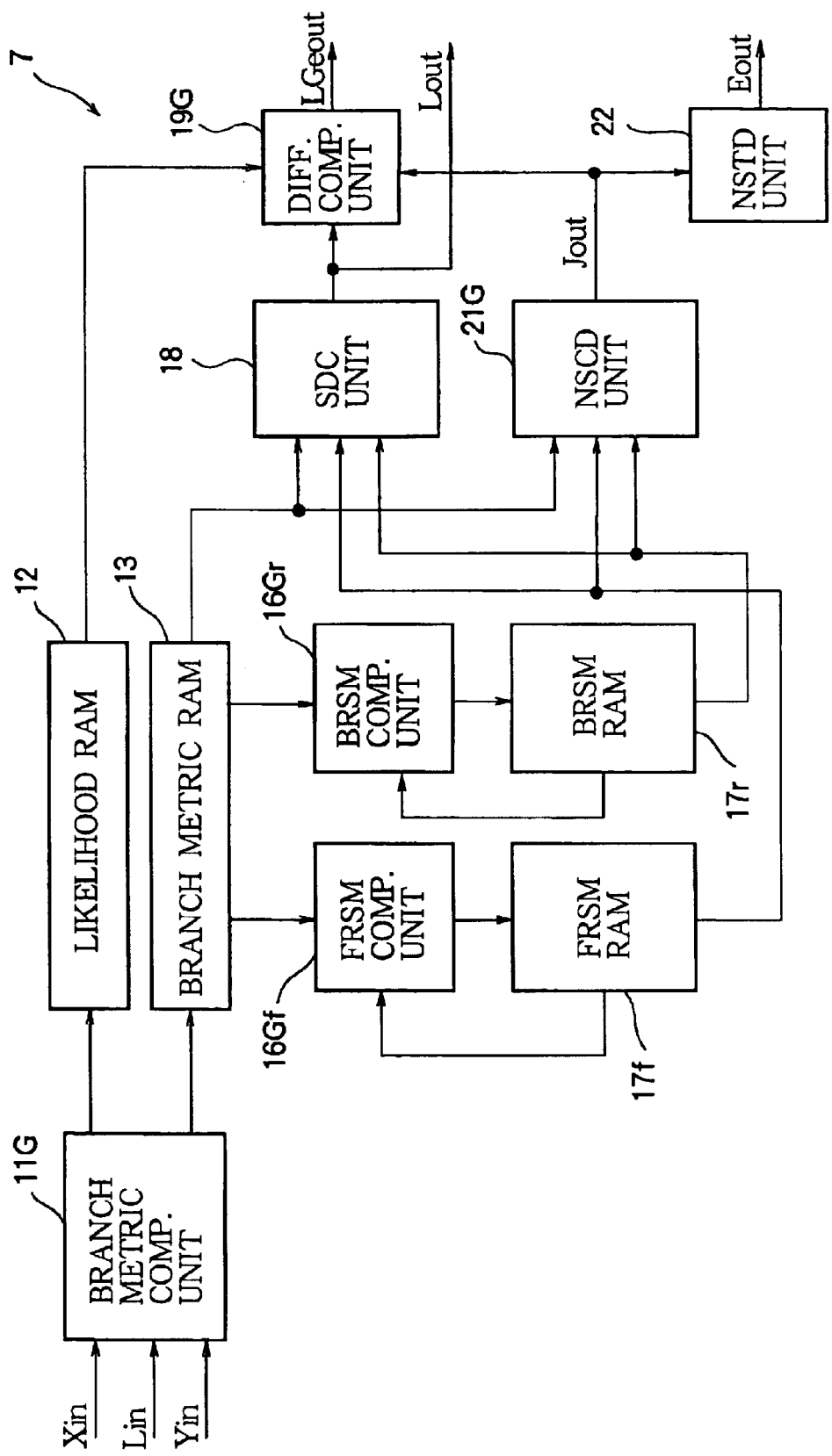
FIG. 17 is a block diagram illustrating the structure of a soft-output decoder according to a seventh embodiment of the invention.

FIG. 17 is a block diagram illustrating the structure of the soft-output decoder according to the seventh embodiment of the invention. The turbo decoder of the seventh embodiment is obtained from the turbo decoder of the third embodiment by replacing each of the soft-output decoders 3a, 3b in FIG. 9 with the soft-output decoder 7 in FIG. 17. In the turbo decoder of the seventh embodiment, the soft-output decoder outputs an extrinsic information likelihood stream LGeout-a or LGeout-b and receives an a-priori information likelihood stream LGin-a or LGin-b while soft-output decoders 3a, 3b output the extrinsic information likelihood streams LCeout-a and LCeout-b and receive the a-priori information likelihood streams LCin-a and LCin-b.

The soft-output decoder 7 in the seventh embodiment comprises a branch metric computation (COMP.) unit 11G, a likelihood RAM 12, a branch metric RAM 13, a forward recursion state metric (FRSM) computation unit 16 Gf, a backward recursion state metric (BRSM) computation unit 16Gr, a forward recursion state metric RAM 17f, a backward recursion state metric RAM 17r, a soft-decision computation (SDC) unit 18, a differential computation unit 19G, a next-stage computation decision (NSDC) unit 21G, and a next-stage termination decision (NSTC) unit 22. The seventh embodiment is obtained from the third embodiment by replacing the branch metric computation unit 11C, forward recursion state metric computation unit 16Cf, backward recursion state metric computation unit 16Cr, differential computation unit 19C, and next-stage computation decision unit 21 shown in FIG. 10 with the branch metric computation unit 11G, forward recursion state metric computation unit 16 Gf, backward recursion state metric computation unit 16Gr, differential computation unit 19G, and next-stage computation decision unit 21G respectively.

The operation of the soft-output decoder 7 in the seventh embodiment will be described below, omitting descriptions of operations that are performed identically in the soft-output decoder 3 of the third embodiment (FIG. 10).

The soft-output decoder 7 of the seventh embodiment differs from the soft-output decoder 3 of the third embodiment (FIG. 10) in that forward recursion state metrics and backward recursion state metrics, as well as next-stage computation decision flags, are embedded in the extrinsic information likelihood stream LGeout output to the next-stage soft-output decoder (the other soft-output decoder), and the forward recursion state metrics and backward recursion state metrics, as well as a-priori computation decision flags, are embedded in the a-priori information likelihood stream LGin which the soft-output decoder 7 receives from the preceding-stage soft-output decoder (the other soft-output decoder).

The next-stage computation decision unit 21G differs from the next-stage computation decision unit 21 of the second embodiment (FIG. 7) in that when next-stage computation decision unit 21G sets a next-stage computation decision flag to '1', it outputs the forward recursion state metric values and backward recursion state metric values for the corresponding position, as well as the '1' flag value, to the differential computation unit 19G.

The differential computation unit 19G differs from the differential computation unit 19C of the third embodiment (FIG. 10) in that if the next-stage computation decision flag is '1', the differential computation unit 19G outputs the '1' flag value, the forward recursion state metric values of the corresponding position, and the backward recursion state metric values of the corresponding position. Both the next-stage computation decision flags and the relevant state metrics are thus embedded in the extrinsic information likelihood stream LGeout.

The extrinsic information likelihood stream LGeout has a '0' flag and an extrinsic information likelihood for each position where the next-stage computation decision flag is '0', and has a '1' flag, a set of forward recursion state metric values, and a set of backward recursion state metric values for each position where the next-stage computation decision flag is '1'. The extrinsic information likelihood stream LGeout is interleaved or deinterleaved, then input to the next soft-output decoder (the other soft-output decoder) as the a-priori information likelihood stream LGin. (The next-stage computation decision flags and any embedded state metrics are input as a-priori information.)

The branch metric computation unit 11G differs from the branch metric computation unit 11C in the third embodiment (FIG. 10) in that it detects the forward recursion state metrics and backward recursion state metrics embedded in the input a-priori information likelihood stream LGin, and writes these a-priori state metrics in the branch metric RAM 13, together with the branch metric values.

Like the forward recursion state metric computation unit 16Cf of the third embodiment (FIG. 9), the forward recursion state metric computation unit 16Gf operates according to the computation halt information written in the branch metric RAM 13.

If computation halt information is detected (the a-priori computation decision flag is '1'), the forward recursion state metric computation unit 16Gf reads the forward recursion state metric values of the other soft-output decoder from the branch metric RAM 13 and operates in the same way as the forward recursion state metric computation unit 16Ef of the fifth and sixth embodiments (FIG. 13).

Like the backward recursion state metric computation unit 16Cr of the third embodiment (FIG. 9), the backward recursion state metric computation unit 16Gr operates according to the computation halt information written in the branch metric RAM 13.

If computation halt information is detected (the a-priori computation decision flag is '1'), the backward recursion state metric computation unit 16Gr reads the backward recursion state metric values of the other soft-output decoder from the branch metric RAM 13 and operates in the same way as the backward recursion state metric computation unit 16Er of the fifth and sixth embodiments (FIG. 13).

The state metric computation unit 16G of the seventh embodiment (forward recursion state metric computation unit 16Gf or backward recursion state metric computation unit 16Gr) differs from the state metric computation unit 16E of the fifth and sixth embodiments (FIG. 14) in that the state metric values of the other soft-output decoder are read from the branch metric RAM 13 and that the selector 26 operates according to the computation halt information written in the branch metric RAM 13.

The seventh embodiment produces the combined effects of the third and sixth embodiments. In addition, because the next-stage computation decision flags and state metric values are embedded in the extrinsic information likelihood stream output the next soft-output decoder, the seventh embodiment does not require a special signal line for transmitting the next-stage computation decision flags to the next soft-output decoder, a special RAM (computation decision flag RAM 15) for storing the input a-priori computation decision flags, circuits for reading the a-priori computation decision flags from the special RAM, or a special signal line and circuits for reading state metric values from the other soft-output decoder. Accordingly, the circuit scale and power consumption can be reduced.

Eighth Embodiment

Figure 18:
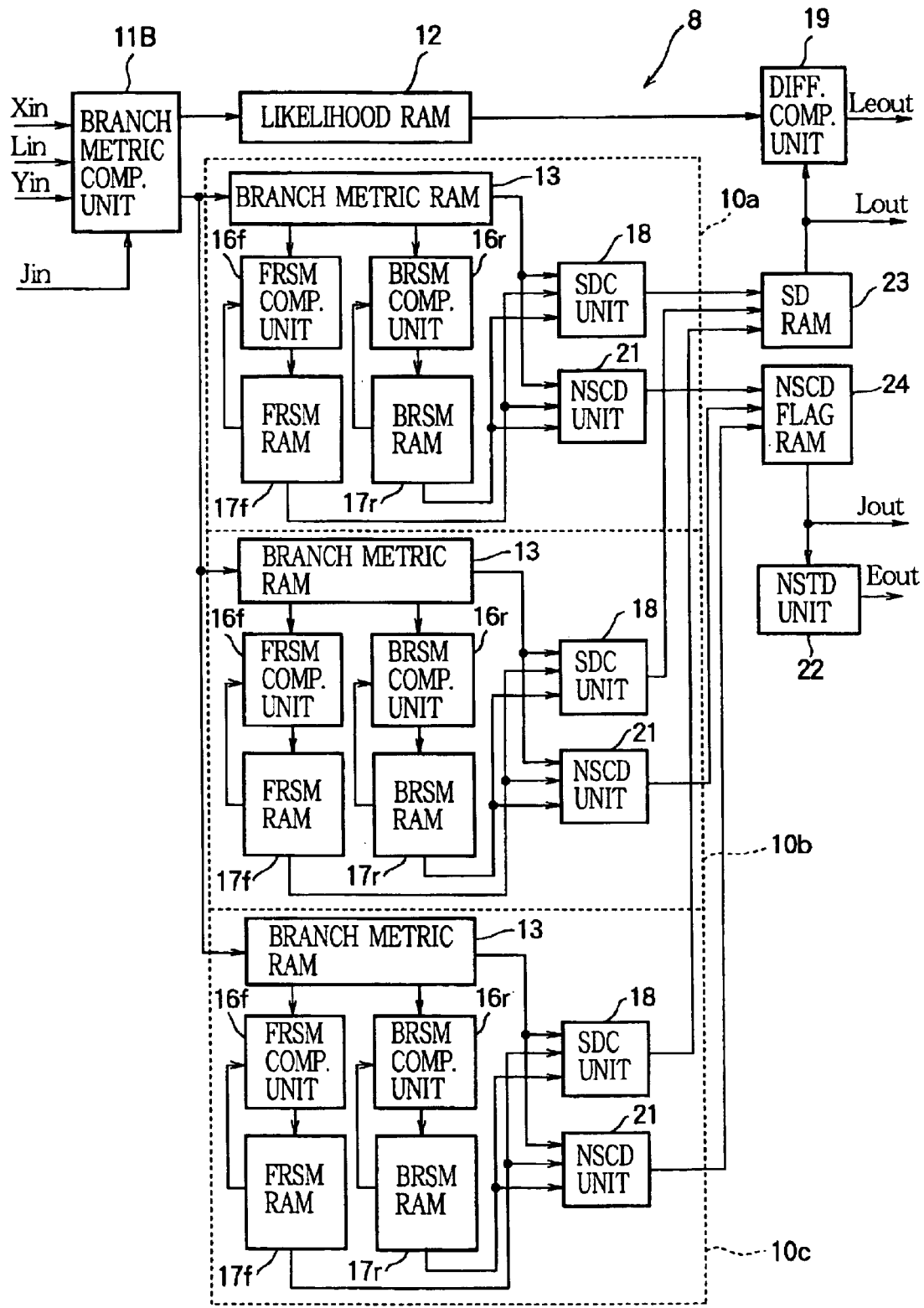
FIG. 18 is a block diagram illustrating the structure of a soft-output decoder according to an eighth embodiment of the invention.

FIG. 18 is a block diagram illustrating the structure of the soft-output decoder according to the eighth embodiment of the invention. The turbo decoder of the eighth embodiment is obtained from the turbo decoder of the second embodiment by replacing each of the soft-output decoders 2a, 2b in FIG. 6 with the soft-output decoder 8 in FIG. 18.

The soft-output decoder 8 in the eighth embodiment comprises operational groups 10a, 10b, 10c, a branch metric computation (COMP.) unit 11B, a likelihood RAM 12, a differential (DIFF.) computation unit 19, a next-stage termination decision (NSTD) unit 22, a soft-decision (SD) RAM 23, and a next-stage computation decision (NSCD) flag RAM 24.

Each of the operational groups 10 (operational group 10a, operational group 10b, operational group 10c) has the same structure, comprising a branch metric RAM 13, a computation decision flag RAM 15 (not shown), a forward recursion state metric (FRSM) computation unit 16f, a backward recursion (BRSM) state metric computation unit 16r, a forward recursion state metric RAM 17f, a backward recursion state metric RAM 17r, a soft-decision computation (SDC) unit 18, and a next-stage computation decision (NSCD) unit 21.

The eighth embodiment is obtained from the second embodiment (FIG. 7) by triplicating the elements in the three parallel operational groups 10, having these three operational groups 10 share the other component elements of the soft-output decoder 2 in the second embodiment, and adding a soft-decision RAM 23 and a next-stage computation decision flag RAM 24.

The soft-decision RAM 23 holds the soft-decision data output from the operational groups 10a, 10b, 10c and outputs a soft-decision data stream Lout to the differential computation unit 19.

The next-stage computation decision flag RAM 24 holds the next-stage computation decision flags output from the operational groups 10a, 10b, 10c and outputs a next-stage computation decision flag stream Jout to the next-stage termination decision unit 22.

The operation of the soft-output decoder 8 of the eighth embodiment will be described below, omitting descriptions of operations that are performed identically in the soft-output decoder 2 of the second embodiment.

If the a-priori computation decision flag for each of the first to the (k−1)-th positions of the data stream is '0' and the a-priori computation decision flag for the k-th position is '1' in the second or subsequent iteration of the soft-decision decoding process, the state metric computations for the k-th position are not performed. The state metrics for the k-th position obtained in the preceding soft-decision decoding process are used for the state metric computations at the (k+1)-th position. Accordingly, the computations for the (k+1)-th and subsequent positions can be performed while the computations for the first to k-th positions (state metric computations, soft-decisions, and next-stage computation decisions) are being performed.

The soft-output decoder 8 of the eighth embodiment accordingly separates the data stream at positions where the a-priori computation decision flag is set to '1' and allocates each separated segment to one of the operational groups 10, allowing the operational groups 10 to perform computations in parallel. The contents of the forward recursion state metric RAM 17f and backward recursion state metric RAM 17r in each operational group 10 are refreshed each time the soft-decision decoding process is iterated.

In the first soft-decision decoding process, all the flags in the a-priori computation decision flag stream Jin are '0', and the state metric computations for all the positions are performed in one operational group, operational group 10a for instance. The other two operational groups 10b, 10c remain inactive, but the contents of the forward recursion state metric RAM 17f and backward recursion state metric RAM 17r of the active operational group (e.g., operational group 10a) in the first soft-decision decoding process are copied into the forward recursion state metric RAM 17f and backward recursion state metric RAM 17r of the inactive operational groups (e.g., operational groups 10b, 10c).

The soft-decision data for all positions output from the soft-decision computation unit 18 of operational group 10a are held in the soft-decision RAM 23 and output as a soft-decision data stream Lout.

The next-stage computation decision flags for all positions output from the next-stage computation decision unit 21 of operational group 10a are held in the next-stage computation decision flag RAM 24 and output as a next-stage computation decision flag stream Jout.

If the a-priori computation decision flags at all positions in the a-priori computation decision flag stream Jin are '0' in the second or a subsequent iteration of soft-decision decoding, the operation performed in the first iteration is repeated.

If an a-priori computation decision flag at any position in the a-priori computation decision flag stream Jin is '1' in the second or a subsequent soft-decision decoding iteration, parallel computations are performed as described below.

If the a-priori computation decision flags for the $k_1$-th and $k_2$-th positions are '1', operational group 10a computes the forward recursion state metrics and backward recursion state metrics between the first position and the $k_1$-th position; operational group 10b computes the forward recursion state metrics and backward recursion state metrics between the $(k_1+1)$-th position and the $k_2$-th position; operational group 10c computes the forward recursion state metrics and backward recursion state metrics between the $(k_2+1)$-th position and the n-th position. Operational group 10b operates in parallel with operational group 10a, and operational group 10c operates in parallel with both operational groups 10a and 10b.

If the a-priori computation decision flags for the $k_1$-th, $k_2$-th, and $k_3$-th positions are '1', the operational groups 10a, 10b, 10c perform parallel computations as described above. Operational group 10a computes the forward recursion state metrics and backward recursion state metrics between the first position and the $k_1$-th position; operational group 10b computes the forward recursion state metrics and backward recursion state metrics between the $(k_1+1)$-th position and the $k_2$-th position; operational group 10c computes the forward recursion state metrics and backward recursion state metrics between the $(k_2+1)$-th position and the $k_3$-th position; whichever one of the three operational groups finishes its computations first computes the forward recursion state metrics and backward recursion state metrics between the $(k_3+1)$-th position and the n-th position.

If the a-priori computation decision flag for just the $k_1$-th position is '1', then operational group 10a, for example, performs metric computations between the first position and the $k_1$-th position, and operational group 10b, for example, concurrently performs metric computations between the $(k_1+1)$-th position and the n-th position, while operational group 10c remains inactive.

The soft-decision data output from the soft-decision computation unit 18 of each of the operational groups 10a, 10b, 10c are written in the soft-decision RAM 23. The next-stage computation decision flags output from the next-stage computation decision unit 21 of each of the operational groups 10a, 10b, 10c are written in the next-stage computation decision flag RAM 24.

When the computations for all positions are completed in the operational groups 10a, 10b, 10c, the soft-decision data for all the positions have been written in the soft-decision RAM 23, and the next-stage computation decision flags for all the positions have been written in the next-stage computation decision flag RAM 24.

The soft-decision RAM 23 outputs the soft-decision data for all those positions to the differential computation unit 19 as a soft-decision data stream Lout. The next-stage computation decision flag RAM 24 outputs the next-stage computation decision flags for all those positions to the next-stage termination decision unit 22 as a next-stage computation decision flag stream Jout.

The eighth embodiment produces the same effect as the second embodiment. In addition, because the multiple operational groups can operate in parallel, the computation speed can be increased, and the computation time can be reduced.

The eighth embodiment described above may have only two operational groups, or may have four or more operational groups.

The eighth embodiment is obtained by adding further operational groups to the second embodiment, but further operational groups may similarly be added to the first or third embodiment. Each operational group added to the first embodiment comprises a branch metric RAM 13, a computation decision flag RAM 15, a forward recursion state metric computation unit 16f, a backward recursion state metric computation unit 16r, a forward recursion state metric RAM 17f, a backward recursion state metric RAM 17r, and a soft-decision computation unit 18. Each operational group added to the third embodiment comprises a branch metric RAM 13, a forward recursion state metric computation unit 16Cf, a backward recursion state metric computation unit 16Cr, a forward recursion state metric RAM 17f, a backward recursion state metric RAM 17r, a soft-decision computation unit 18, and a next-stage computation decision unit 21.

For the sake of brevity, the structures of the first to eighth embodiments have been described as hardware structures and their operations have been described accordingly. The soft-output decoders of each embodiment may also be implemented as software executed by a central processing unit (CPU) or digital signal processor (DSP), or as a combination of hardware and software.

Those skilled in the art will recognize that further variations are possible within the scope of the invention as defined by the apended claims.

What is claimed is:

1. A soft-output decoder performing soft-decision decoding in a decoding apparatus that decodes a received data stream by using a-priori likelihood values to compute metric values pertaining to different decoding positions in the received data stream, the soft-output decoder including a computation decision unit for deciding whether to compute metric values for a given decoding position in the received data stream, based on the a-priori likelihood values.

2. The soft-output decoder of claim 1, further comprising:
a branch metric computation unit for computing branch metric values based on the received data and said a-priori likelihood values; and
a state metric computation unit for computing state metric values based on the branch metric values computed by the branch metric computation unit; wherein
the branch metric computation unit and the state metric computation unit operate according to the decision of the computation decision unit.

3. The soft-output decoder of claim 2, having a plurality of operational groups each including a state metric computation unit, further comprising a storage unit for storing soft-decision data output from the plurality of operational groups, wherein the received data stream is divided into segments at the decoding positions at which the computation decision unit decides not to compute the metric values, different segments of the received data stream are assigned to different operational groups in the plurality of operational groups, and the different operational groups operate in parallel on the assigned segments.

4. The soft-output decoder of claim 1, wherein the computation decision unit compares the a-priori likelihood values with a preset threshold, and decides whether to compute the metric values according to the comparison results.

5. The soft-output decoder of claim 1, further comprising a termination decision unit for terminating soft-decision decoding according to decisions made by the computation decision unit.

6. The soft-output decoder of claim 5, wherein the termination decision unit terminates soft-decision decoding when the computation decision unit decides not to compute any metric values at all for the received data stream.

7. A soft-output decoder for use in a decoding apparatus that decodes a received data stream by performing an iterated series of soft-decision decoding processes, each iteration producing soft-output data for the same positions in the received data stream, the soft-output data obtained at each iteration being used to generate an a-priori likelihood stream for a next iteration, the soft-output decoder comprising:
a branch metric computation unit for computing branch metric values based on the received data stream and the a-priori likelihood stream;
a state metric computation unit for computing state metric values based on the branch metric values computed by the branch metric computation unit; and
a next-stage computation decision unit for making decisions based on the branch metric values and the state metric values, thereby deciding, for each decoding position in the received data stream, whether to calculate metric values in said next iteration,
wherein the branch metric computation unit and the state metric computation unit operate according to the decisions of the next-stage computation decision unit in a preceding iteration in the iterated series of soft-decision decoding processes.

8. The soft-output decoder of claim 7, wherein the next-stage computation decision unit compares absolute values of the soft-decision data with a predetermined threshold value.

9. The soft-output decoder of claim 7, wherein the next-stage computation decision unit receives and uses state metric values obtained in the preceding iteration.

10. The soft-output decoder of claim 9, wherein the next-stage computation decision unit compares an absolute value of a sum of soft-decision data obtained in the current iteration in the iterated series of soft-decision decoding processes and soft-decision data obtained in the preceding iteration with a predetermined threshold.

11. The soft-output decoder of claim 7, further comprising a next-stage termination decision unit for deciding whether soft-decision decoding can end with the next iteration, according to the decisions made by the next-stage computation decision unit.

12. The soft-output decoder of claim 11, wherein the next-stage termination decision unit decides that soft-decision decoding can end when the next-stage computation decision unit decides not to compute any metric values at all in the next iteration.

13. The soft-output decoder of claim 6, wherein the decisions made by the next-stage computation decision unit are embedded in an extrinsic likelihood stream output by the soft-output decoder.

14. The soft-output decoder of claim 13, wherein state metric values obtained by the state metric computation unit are also embedded in the extrinsic likelihood stream.

15. The soft-output decoder of claim 7, wherein the a-priori likelihood stream includes results of the decisions of the next-stage computation decision unit in the preceding iteration.

16. The soft-output decoder of claim 15, wherein the a-priori likelihood stream also includes state metric values obtained by the state metric computation unit in the preceding iteration.

17. The soft-output decoder of claim 7, wherein the state metric computation unit, when directed by the next-stage computation decision unit in the preceding iteration not to calculate metric values at a position in the received data stream, uses state metric values obtained previously for said position.

18. The soft-output decoder of claim 7, wherein the state metric computation unit, when directed by the next-stage computation decision unit in the preceding iteration not to calculate metric values at a position in the received data stream, selects maximum and minimum permissible state metric values on the basis of state metric values obtained for said position in a previous iteration, and uses the selected maximum and minimum values in the current iteration in the iterated series of soft-decision decoding processes.

19. The soft-output decoder of claim 7, wherein the state metric computation unit, when directed by the next-stage computation decision unit in the preceding iteration not to calculate metric values at a position in the received data stream, generates values by ranking the state metric values obtained for said position in the preceding iteration, and uses the generated values in the current iteration in the iterated series of soft-decision decoding processes.

20. The soft-output decoder of claim 7, having a plurality of operational groups each including a state metric computation unit and a next-stage computation decision unit, further comprising:

a first storage unit for storing soft-decision data output from the plurality of operational groups; and a second storage unit for storing decision results output by the next-stage computation decision unit in the plurality of operational groups;

wherein the received data stream is divided into segments at the decoding positions at which, in the preceding iteration, the next-stage computation decision unit decides not to compute metric values, different segments of the received data stream are assigned to different operational groups in the plurality of operational groups, and the different operational groups operate in parallel on the assigned segments.

* * * * *